(12) United States Patent
Jang et al.

(10) Patent No.: US 11,690,258 B2
(45) Date of Patent: Jun. 27, 2023

(54) DISPLAY DEVICE

(71) Applicant: SAMSUNG DISPLAY CO., LTD., Yongin-si (KR)

(72) Inventors: Mi Jang, Seongnam-si (KR); Do Hyun Kwon, Seongnam-si (KR); Min Jung Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 100 days.

(21) Appl. No.: 16/855,003

(22) Filed: Apr. 22, 2020

(65) Prior Publication Data

US 2021/0005689 A1 Jan. 7, 2021

(30) Foreign Application Priority Data

Jul. 2, 2019 (KR) .......................... 10-2019-0079406

(51) Int. Cl.
*H10K 59/124* (2023.01)
*H10K 59/131* (2023.01)
*H01L 27/12* (2006.01)

(52) U.S. Cl.
CPC ......... *H10K 59/124* (2023.02); *H10K 59/131* (2023.02); *H01L 27/124* (2013.01); *H01L 27/1248* (2013.01)

(58) Field of Classification Search
CPC ............. H01L 27/1255; H01L 27/3276; H01L 27/3258; H01L 27/1249; H01L 27/124; H10K 59/131; H10K 59/124
See application file for complete search history.

(56) References Cited

U.S. PATENT DOCUMENTS

| 2015/0108484 | A1* | 4/2015 | Park | H01L 27/1255 438/23 |
|---|---|---|---|---|
| 2015/0168777 | A1 | 6/2015 | Park et al. | |
| 2015/0287747 | A1 | 10/2015 | Cheng et al. | |
| 2016/0118451 | A1 | 4/2016 | Youn et al. | |
| 2016/0204185 | A1 | 7/2016 | Iijima et al. | |
| 2017/0077199 | A1* | 3/2017 | Nguyen | H10K 77/111 |

(Continued)

FOREIGN PATENT DOCUMENTS

| CN | 108054291 | 5/2018 |
|---|---|---|
| KR | 10-0563065 | 3/2006 |

(Continued)

OTHER PUBLICATIONS

European Search Report dated Nov. 5, 2020 issued in corresponding European Patent Application No. 20182809.2.

*Primary Examiner* — Vongsavanh Sengdara
(74) *Attorney, Agent, or Firm* — F. Chau & Associates, LLC

(57) ABSTRACT

A display device including: a substrate; a plurality of transistors disposed on the substrate; and a multi-layer insulating film disposed on the transistors, wherein the multi-layer insulating film includes a first insulating film and a second insulating film, the multi-layer insulating film includes a first region in which the first insulating film and the second insulating film overlap each other in a direction perpendicular to the substrate and a second region in which the first insulating film is disposed, the first region overlaps the plurality of transistors, and a modulus of the second insulating film is lower than a modulus of the first insulating film.

19 Claims, 18 Drawing Sheets

(56) References Cited

U.S. PATENT DOCUMENTS

2018/0286936 A1  10/2018  Lee et al.
2019/0013372 A1* 1/2019  Yasukawa ............ H10K 59/124

FOREIGN PATENT DOCUMENTS

| KR | 10-2018-0013369 | 2/2018 |
| KR | 10-2018-0045929 | 5/2018 |
| KR | 10-2018-0045968 | 5/2018 |

* cited by examiner

DISPLAY DEVICE

CROSS-REFERENCE TO RELATED APPLICATION

This application claims priority under 35 U.S.C. § 119 to Korean Patent Application No. 10-2019-079406 filed in the Korean Intellectual Property Office on Jul. 2, 2019, the disclosure of which is incorporated by reference herein in its entirety.

(a) Technical Field

The present invention relates to a display device.

(b) Description of the Related Art

Display devices for presentation of information in visual form may include a liquid crystal display (LCD), a plasma display panel (PDP), an organic light emitting diode device (OLED device), a field effect display (FED), an electrophoretic display device, and the like.

Since the OLED device has a self-luminance characteristic and does not use a separate light source, a thickness and weight thereof may be reduced. In addition, since the OLED device has high-grade characteristics such as low power consumption, high luminance, and high response speed, the OLED device is being developed as a next-generation display device.

Recently, a bendable, foldable, or extensible display device has been developed. In an extensible display device, light-emitting elements are formed on a stretchable substrate. However, when the stretchable substrate is stretched or an impact is applied thereto, the light-emitting elements or wires stacked on an upper portion of the stretchable substrate may be damaged.

SUMMARY

An exemplary embodiment of the present invention provides a display device including: a substrate; a plurality of transistors disposed on the substrate; and a multi-layer insulating film disposed on the transistors, wherein the multi-layer insulating film may include a first insulating film and a second insulating film, the multi-layer insulating film may include a first region in which the first insulating film and the second insulating film overlap each other in a direction perpendicular to the substrate and a second region in which the first insulating film is disposed, the first region may overlap the plurality of transistors, and a modulus of the second insulating film may be lower than a modulus of the first insulating film.

A plurality of second insulating films may overlap the transistors and be spaced apart from each other, and the first insulating film may be disposed between the second insulating films and on an upper surface of the second insulating films.

The second region may not overlap the transistors in the direction perpendicular to the substrate.

The modulus of the first insulating film may be 5 to 30 times the modulus of the second insulating film.

The modulus of the first insulating film may be 80 GPa to 150 GPa.

The modulus of the second insulating film may be 5 GPa to 10 GPa.

The first insulating film may include an inorganic material, and the second insulating film includes an organic material.

The first region may overlap the data line.

The first region may be disposed between a plurality of scan lines.

The display device may further include an interlayer insulating film disposed between the transistor and the multi-layer insulating film, the interlayer insulating film and the second insulating film may contact each other in the first region, and the interlayer insulating film and the first insulating film may contact each other in the second region.

Another exemplary embodiment of present invention provides a display device including: a substrate; a plurality of transistors disposed on the substrate; and a multi-layer insulating film disposed on the transistors, wherein the multi-layer insulating film may include a first insulating film, a second insulating film, and a third insulating film, the multi-layer insulating film may include a first region and a second region, the second insulating film, the third insulating film, and the first insulating film may be arranged in sequence in the first region, the third insulating film, the second insulating film, and the first insulating film may be arranged in sequence in the second region, and a modulus of the second insulating film may be lower than a modulus of the first insulating film and a modulus of the third insulating film.

The first region may overlap the transistors, and the second region may not overlap the transistors.

The second insulating film may include a plurality of portions spaced apart from each other, and the third insulating film may contact upper and side surfaces of the portions of second insulating film.

The display device may further include an interlayer insulating film disposed between the transistor and the multi-layer insulating film, the interlayer insulating film and the second insulating film may contact each other in the first region, and the interlayer insulating film and the third insulating film may contact each other in the second region.

The modulus of the third insulating film may be 5 to 30 times the modulus of the second insulating film.

The modulus of the third insulating film may be 80 GPa to 150 GPa.

The first insulating film and the third insulating film may include the same material.

The first and third insulating films may include an inorganic material, and the second insulating film may include an organic material.

The first region may overlap a data line.

The first region may be disposed between adjacent scan lines.

Another exemplary embodiment of the present invention provides a display device including: a substrate; a plurality of transistors disposed on the substrate; and a multi-layer insulating film disposed on the transistors, wherein the multi-layer insulating film may include a first insulating film, a second insulating film, and a third insulating film, the multi-layer insulating film may include a first region and a second region, the second insulating film and the first insulating film may overlap each other in the first region, the third insulating film and the first insulating film may overlap each other in the second region, and a modulus of the third insulating film may be larger than a modulus of the second insulating film.

The modulus of the third insulating film may be smaller than a modulus of the first insulating film.

The first region may overlap the transistors, and the second region may not overlap the transistors.

The second insulating film and the third insulating film may include an organic material, and the first insulating film may include an inorganic material.

The display device may further include an interlayer insulating film disposed between the transistor and the multi-layer insulating film, the second insulating film and the interlayer insulating film may contact each other in the first region, and the third insulating film and the interlayer insulating film may contact each other in the second region.

Heights of the second insulating film and the third insulating film may be the same.

The modulus of the third insulating film may be 2 to 30 times the modulus of the second insulating film.

The modulus of the first insulating film may be 80 GPa to 150 GPa.

The first region may overlap a data line.

The first region may be disposed between adjacent scan lines.

Another exemplary embodiment of the present invention provides a display device including: a substrate; a plurality of transistors disposed on the substrate; an interlayer insulating film disposed on the transistors; and a multi-layer insulating film disposed on the interlayer insulating film, wherein the multi-layer insulating film may include a first insulating film and a second insulating film, the multi-layer insulating film may include a first region overlapping the transistor and a second region not overlapping the transistor, the second insulating film may contact the interlayer insulating film in the first region, the first insulating film may contact the interlayer insulating film in the second region, and a modulus of the first insulating film may be larger than a modulus of the second insulating film.

The modulus of the first insulating film may be 5 to 30 times the modulus of the second insulating film.

The modulus of the first insulating film may be 80 GPa to 150 GPa.

The modulus of the second insulating film may be 5 GPa to 10 GPa.

The first region may overlap a data line.

The first region may be disposed between adjacent scan lines.

An exemplary embodiment of the present invention provides a display device including: a substrate; first and second transistors disposed on the substrate; and a multi-layer insulating film disposed on the first and second transistors, wherein the multi-layer insulating film includes a first insulating film and a second insulating film, the first insulating film and the second insulating film overlap each other and the first and second transistors, the first insulating film and the second insulating directly contact an interlayer insulating film, and a modulus of the second insulating film is different than a modulus of the first insulating film.

First and second electrodes of the first transistor may be disposed in the interlayer insulating film.

The first insulating film may be disposed on an upper and a side surface of the second insulating film.

DETAILED DESCRIPTION OF THE EMBODIMENTS

Figure 1:
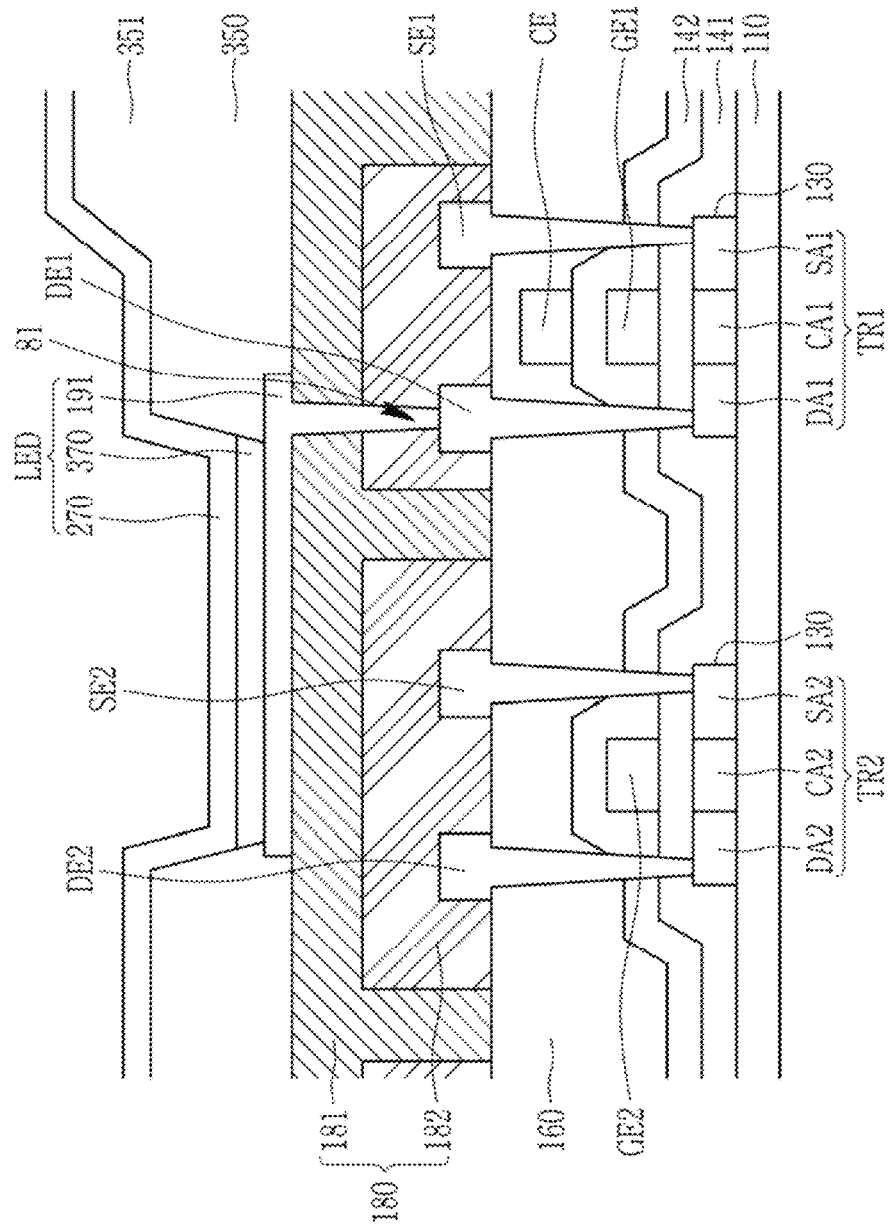
FIG. 1 illustrates a cross-sectional view of a display device according to an exemplary embodiment of the present invention.

Hereinafter, exemplary embodiments of the present invention will be described more fully with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thicknesses of layers, films, panels, regions, etc., may be exaggerated for clarity.

It will be understood that when an element such as a layer, film, region, or substrate is referred to as being "on" another element, it can be directly on the other element or intervening elements may also be present.

Further, throughout the specification, the phrase "in a plan view" may mean viewing a target portion from the top, and the phrase "in a cross-section" may mean viewing a cross-section formed by vertically cutting a target portion from the side.

A display device according to an exemplary embodiment of the present invention will now be described in detail with reference to the accompanying drawings.

FIG. 1 illustrates a cross-sectional view of a display device according to an exemplary embodiment of the present invention. The cross-section of FIG. 1 is schematically shown for easier understanding of the present invention.

Referring to FIG. 1, a first transistor TR1 and a second transistor TR2 are disposed on a substrate 110. The first transistor TR1 may be a driving transistor, and the second transistor TR2 may be a switching transistor.

The first transistor TR1 includes: a semiconductor layer 130 including a source region SA1, a drain region DA1, and a channel region CA1; a source electrode SE1 and a drain electrode DE1 connected to the semiconductor layer 130; a gate electrode GE1 that is insulated from the semiconductor layer 130 by a first gate insulating film 141 and overlaps the channel region CAL; and a storage electrode CE that is insulated from the gate electrode GE1 by a second gate insulating film 142 and overlaps the gate electrode GE. The storage electrode CE, the source electrode SE1, and the drain electrode DE1 are insulated by an interlayer insulating film 160.

The second transistor TR2 includes: the semiconductor layer 130 including a source region SA2, a drain region DA2, and a channel region CA2; a source electrode SE2 and a drain electrode DE2 connected to the semiconductor layer 130; and a gate electrode GE2 that is insulated from the semiconductor layer 130 by the first gate insulating film 141 and overlaps the channel region CA2. The gate electrode GE2 is insulated from the source electrode SE2 and the drain electrode DE2 by the second gate insulating film 142 and the interlayer insulating film 160.

The drain electrode DE1 of the first transistor TR1 is connected to a first electrode 191 through a contact hole 81 formed in an insulating film 180. A partition wall 350 including a protrusion 351 is disposed on the insulating film 180. In some embodiments of the present invention, the protrusion 351 may be omitted.

The partition wall 350 has an opening overlapping the first electrode 191, and a light emitting layer 370 is disposed in the opening. A second electrode 270 is disposed on the light emitting layer 370 and the partition wall 350. The first electrode 191, the light emitting layer 370, and the second electrode 270 form a light emitting diode (LED).

Referring to FIG. 1, in the display device according to the present embodiment, the insulating film 180 includes a first insulating film 181 and a second insulating film 182. In this case, the second insulating film 182 overlaps the first and second transistors TR1 and TR2. In other words, the first insulating film 181 overlaps the entire surface of the substrate 110, but the second insulating film 182 overlaps a partial region of the substrate 110, in particular, the first and second transistors TR1 and TR2.

In the present embodiment, the modulus of the first insulating film 181 is greater than that of the second insulating film 182. The modulus of the first insulating film 181 may be 80 GPa to 150 GPa, and the modulus of the second insulating film 182 may be 5 GPa to 10 GPa. For example, the modulus of the first insulating film 181 may be 5 to 30 times that of the second insulating film 182.

The first insulating film 181 may include an inorganic material, and the second insulating film 182 may include an organic material. For example, the first insulating film 181 may include a Si-based insulating film such as a SiNx or a SiOx. For example, x may be 1 to 4. The second insulating film 182 may include an organic material, for example, a polyimide.

When the insulating film 180 includes the first insulating film 181 and the second insulating film 182 with different moduli from each other and the second insulating film 182 is disposed to just overlap the first and second transistors TR1 and TR2, a bright spot failure is prevented from occurring when an impact is applied to a display panel of the display device. This is because the impact applied to the display panel is transmitted to the first insulating film 181 having a high modulus, and thus, the transistor under the second insulating film 182 with a low modulus is protected.

In other words, since regions of the first and second transistors TR1 and TR2 in which the bright spot failure may occur overlap the second insulating film 182 having a low modulus, the impact is not transmitted thereto, and thus, the impact applied to the display panel is transmitted along the first insulating film 181 having a high modulus. As can be seen from the cross-section of FIG. 1, since a region where the first insulating film 181 is disposed by itself without the second insulating film 182 is a region where no transistor or the like is disposed, even if a crack occurs in the interlayer insulating film 160 and the like overlapping the first insulating film 181 by an impact, no bright spot failure occurs.

Figure 2:
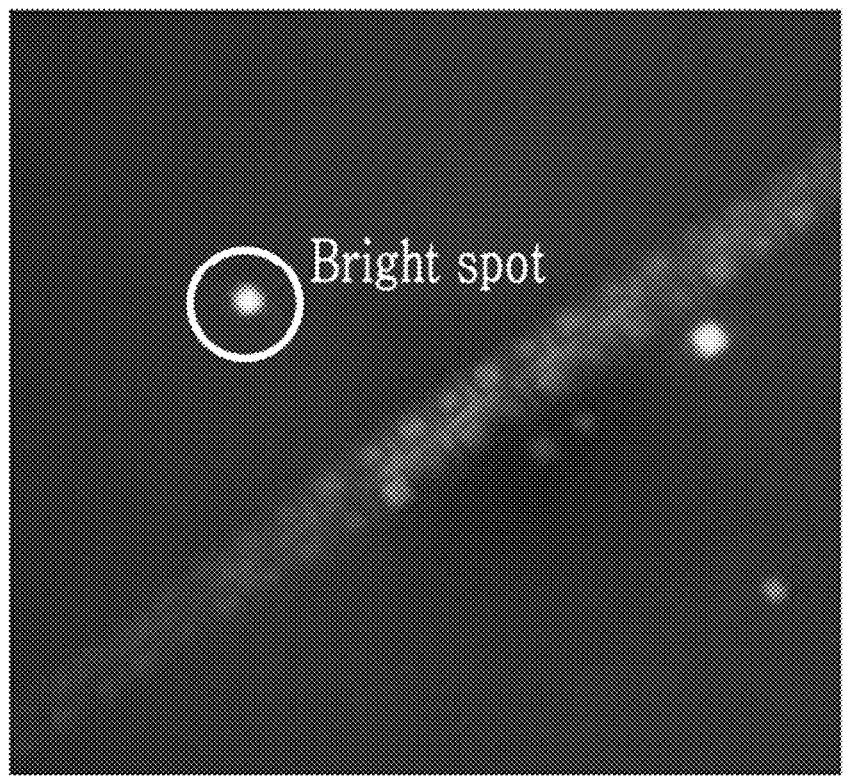
FIG. 2 illustrates an image in which a bright spot failure occurs in a display device according to a comparative example.
Figure 3:
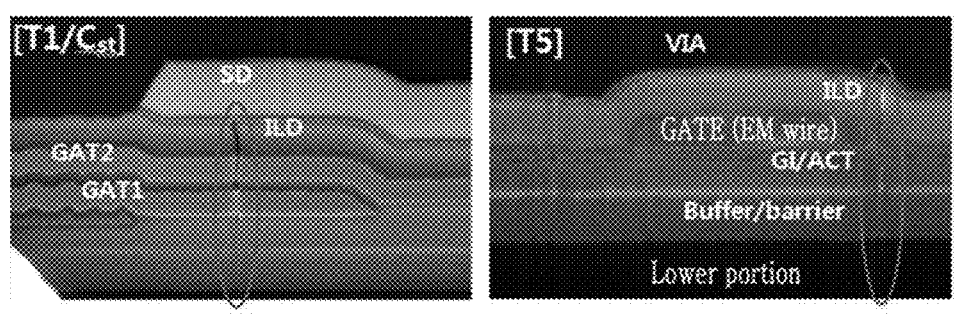
FIG. 3 illustrates an image in which cracks occur in an interlayer insulating film and the like overlapping a transistor in a display device according to a comparative example.

FIG. 2 illustrates an image in which a bright spot failure occurs in a display device according to a comparative example. FIG. 3 illustrates an image in which cracks occur in an interlayer insulating film and the like overlapping a transistor in a display device according to a comparative example.

Referring to FIG. 2, in the display device according to the comparative example in which the insulating film 180 is a single layer, it was confirmed that the bright spot failure occurred after evaluating an impact resistance. FIG. 3 shows an image in which a crack occurs in the transistor of the display device according to the comparative example. When a crack occurs in the gate insulating film (GI) and the interlayer insulating film (ILD) in the regions overlapping the transistor (T1 and T5), the same bright spot as in FIG. 2 is viewed.

In FIG. 3, the left image may show a transistor/storage capacitor T1/Cst which includes a pair of electrodes GAT1 and GAT2, a source/drain region SD and an interlayer dielectric ILD layer. The right image of FIG. 3 may show another transistor T5 having a gate (EM wire) arranged on a gate insulator (GI/ACT), a buffer/barrier and a lower portion of an insulating film. An interlayer dielectric ILD layer and a via may overlap the transistor T5.

However, in a case of the display device according to the present embodiment, the second insulating film 182 having a low modulus is disposed in the region overlapping a transistor. Thus, an external impact is transmitted through the first insulating film 181 having a higher modulus, and the transistor under the second insulating film 182 may be protected from the impact. Since a region where only the first insulating film 181 is disposed is a region where the transistor is not disposed, even if a crack occurs due to a transmitted impact, a bright spot is not viewed.

Figure 4:
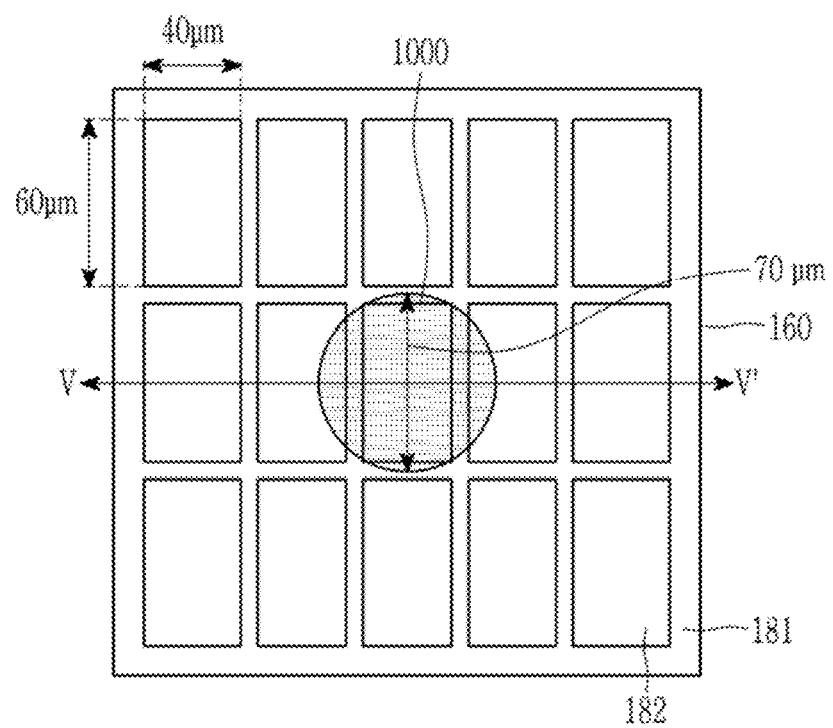
FIG. 4 is a diagram for explaining impact resistance of a display device according to an exemplary embodiment of the present invention.
Figure 5:
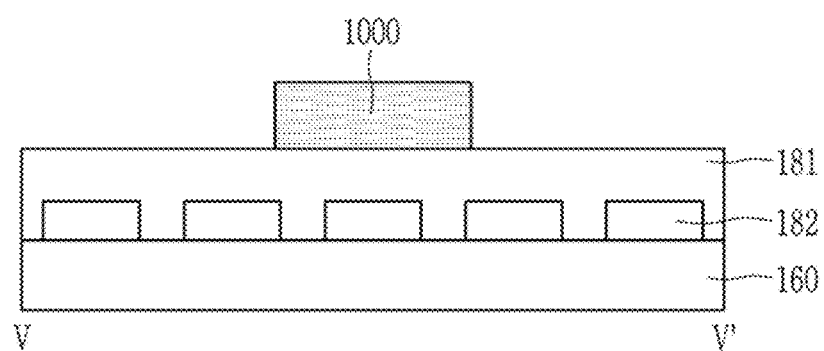
FIG. 5 illustrates a cross-sectional view taken along line V-V' of FIG. 4.
Figure 6:
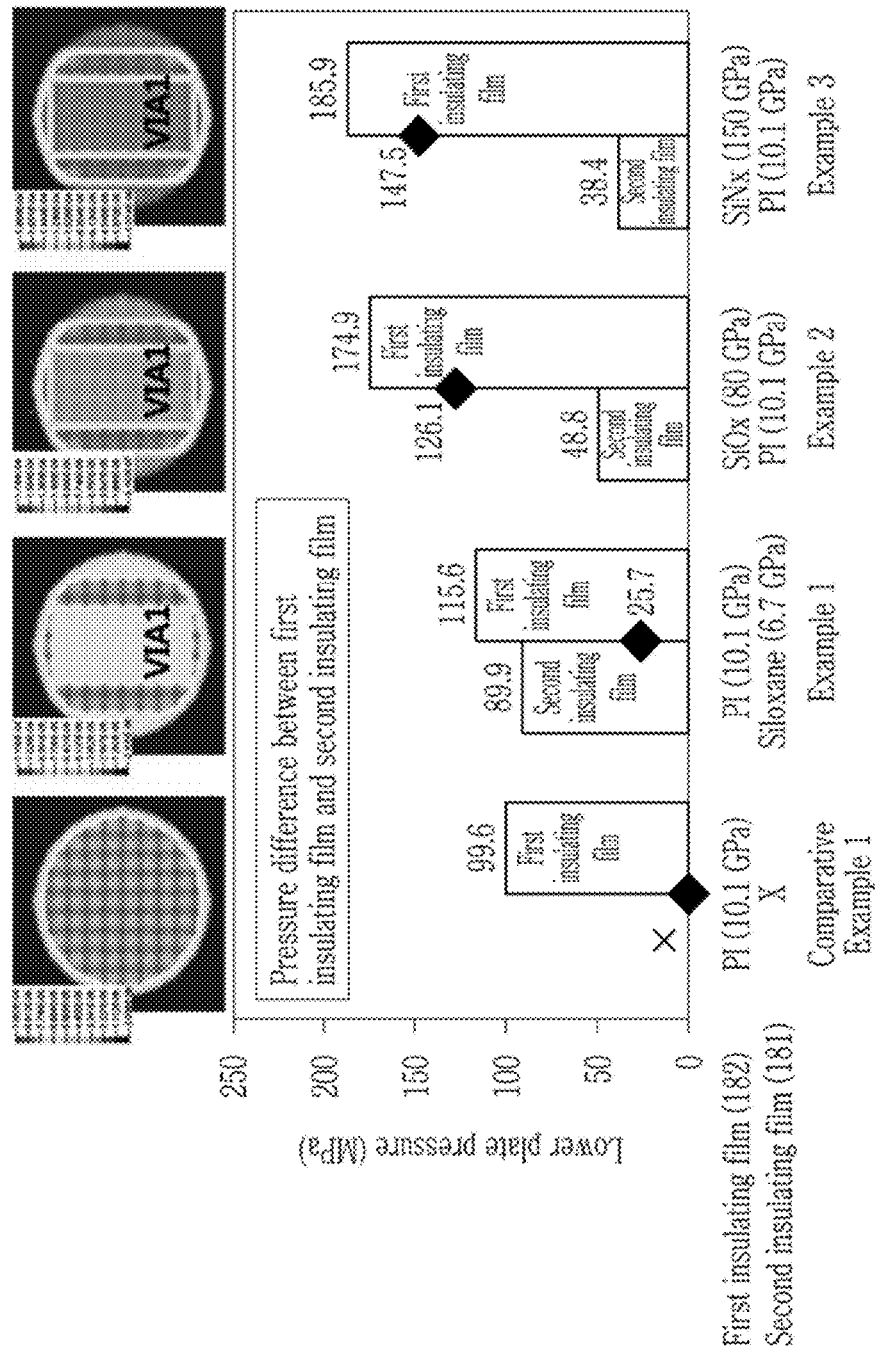
FIG. 6 illustrates experimental results of FIG. 4.

FIG. 4 to FIG. 6 show results of an experiment on impact resistance of a display device according to an exemplary embodiment of the present invention. FIG. 5 illustrates a cross-sectional view taken along line V-V' of FIG. 4. Referring to FIG. 4 and FIG. 5, a plurality of second insulating films 182 separated from each other are disposed on the interlayer insulating film 160. The first insulating film 181 is disposed on an upper surface of each of the second insulating films 182 and between adjacent second insulating films 182. Referring to FIG. 4 and FIG. 5, the first insulating film 181 covers the plurality of second insulating films 182 that are separated from each other. Each of the second insulating films 182 may have a rectangular shape of 40 μm in width and 60 μm in length.

A circular pressure plate 1000 having a diameter of 70 μm was disposed on the first insulating film 181, and a pressure of 1 N was applied.

The pressures applied to the interlayer insulating film 160 were measured while variously changing the materials of the first insulating film 181 and the second insulating film 182 and the measured pressures are shown in FIG. 6.

In FIG. 6, the pressure applied to the interlayer insulating film 160 is divided into a pressure at a portion of the interlayer insulating film 160 in contact with the first insulating film 181 and a pressure at a portion of the interlayer insulating film 160 in contact with the second insulating film 182. In the image shown in FIG. 6, a base material of VIA1 refers to the second insulating film 181. The fact that a difference between the pressure at the portion of the interlayer insulating film 160 in contact with the first insulating film 181 and the pressure at the portion of the interlayer insulating film 160 in contact with the second insulating film 182 is large means that the applied pressure acts on the first insulating film 181, while the lower portion of the second insulating film 182 is protected from the impact.

In Comparative Example 1 of FIG. 6, only the first insulating film 181 including a polyimide is disposed without the second insulating film 182. In this case, the pressure applied to the lower portion of the first insulating film 181 was 99.6 MPa.

Example 1 of FIG. 6 shows the results of an experiment in which the second insulating film 182 was tested as siloxane (which has a modulus of 6.7 GPa) and the first insulating film 181 was tested as a polyimide (which has a modulus of 10.1 GPa). In this case, it can be confirmed that higher pressure was applied to the lower portion of the first insulating film 181 (115.6 MPa) than the lower portion of the second insulating film 182 (89.9 MPa).

Example 2 of FIG. 6 shows the results of an experiment in which the second insulating film 182 was tested as a polyimide (which has a modulus of 10.1 GPa) and the first insulating film 181 was tested as a SiOx (which has a modulus of 80 GPa). In this case, it can be confirmed that higher pressure was applied to the lower portion of the first insulating film 181 (174.9 MPa) than the lower portion of the second insulating film 182 (48.8 MPa). Comparing Examples 1 and 2, it can be seen that a difference in modulus between the first insulating film 181 and the second insulating film 182 is larger in Example 2, and thus, a difference between the pressures applied to the lower portions thereof (126.1 versus 25.7) is larger in Example 2.

Example 3 of FIG. 6 shows the results of an experiment in which the second insulating film 182 was tested as a polyimide (which has a modulus of 10.1 GPa) and the first insulating film 181 was tested as a SiNx (which has a modulus of 150 GPa). In this case, it can be confirmed that higher pressure was applied to the lower portion of the first insulating film 181 (185.9 MPa) than the lower portion of the second insulating film 182 (38.4 MPa). Comparing Examples 1 and 3, it can be seen that a difference in modulus between the first insulating film 181 and the second insulating film 182 is larger in Example 3, and thus, a difference between the pressures applied to the lower portion thereof (147.5) is also larger in Example 3.

As described above, in the display device according to an exemplary embodiment of the present invention, the insulating film 180 includes the first insulating film 181 and the second insulating film 182 having different moduli, and the second insulating film 182 having a lower modulus overlaps the transistor. Therefore, when an impact is applied to the display device, the impact is transmitted through the first insulating film 181 having a higher modulus, so that damage to the transistor may be prevented. Accordingly, it is possible to prevent a bright spot failure from occurring.

Figure 7:
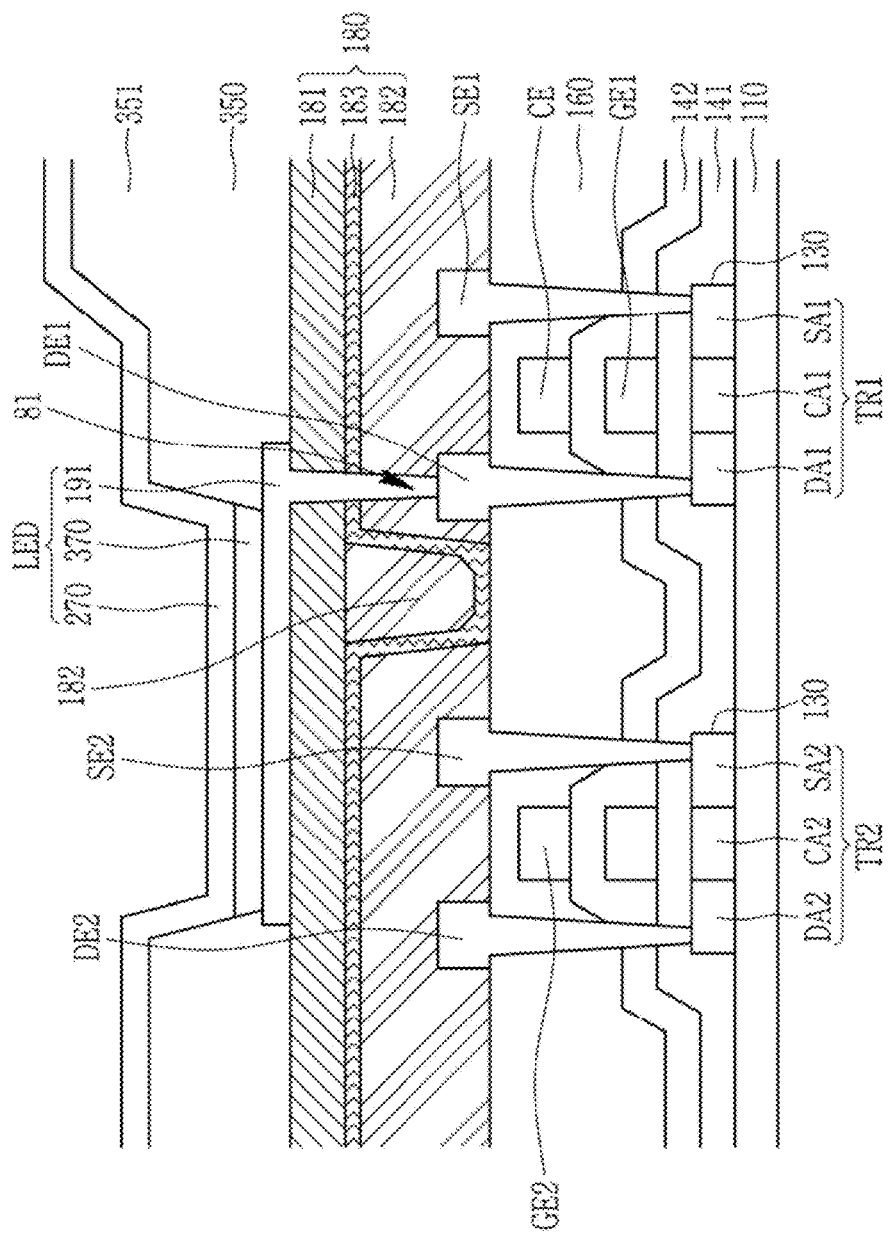
FIG. 7 illustrates a cross-sectional view of a display device according to another exemplary embodiment of the present invention that illustrates the same cross-section as in FIG. 1.

FIG. 7 illustrates a cross-sectional view of a display device according to another exemplary embodiment of the present invention. Except for the structure of the insulating film 180, the display device of FIG. 7 is the same as the display device of FIG. 1. A detailed description of the same components may be omitted.

Referring to FIG. 7, the insulating film according to the present embodiment includes the first insulating film 181, the second insulating film 182, and a third insulating film 183.

The modulus of the first insulating film 181 is larger than that of the second insulating film 182. The modulus of the first insulating film 181 may be 80 GPa to 150 GPa, and the modulus of the second insulating film 182 may be 5 GPa to 10 GPa. The modulus of the first insulating film 181 may be 5 to 30 times that of the second insulating film 182.

The first insulating film 181 may include an inorganic material, and the second insulating film 182 may include an organic material. For example, the first insulating film 181 may include a Si-based insulating film such as a SiNx or a SiOx. For example, x may be 1 to 4. The second insulating film 182 may include an organic material, for example, a polyimide. The second insulating film 182 includes a plurality of portions separated from each other.

The third insulating film 183 may include an inorganic material. The modulus of the third insulating film 183 is larger than that of the second insulating film 182. For example, the modulus of the third insulating film 183 may be 80 GPa to 150 GPa. The first insulating film 181 and the third insulating film 183 may include the same material. However, the present invention is not limited thereto and the first insulating film 181 and the third insulating film 183 may include different materials from each other.

Referring to FIG. 7, the third insulating film 183 is disposed between second insulating films 182 that are spaced apart from each other. In other words, the third insulating film 183 contacts the interlayer insulating film 160 and the first insulating film 181 while also contacting the upper surface and the side surface of the second insulating films 182 that are spaced apart from each other.

In this case, the second insulating film 182 contacts the interlayer insulating film 160 in a region overlapping the first and second transistors TR1 and TR2. In addition, the third insulating film 183 contacts the interlayer insulating film 160 in a region not overlapping the first and second transistors TR1 and TR2.

In other words, in a region (hereinafter referred to as a first region) in which a transistor (TR1 or TR2) is protected, the first, second, and third insulating films 181-183 of the insulating film 180 are disposed in the order of the second insulating film 182 contacting the interlayer insulating film 160, the third insulating film 183, and the first insulating film 181. In addition, in a region (hereinafter referred to as a second region) in which a transistor (TR1 or TR2) is not protected and thus may absorb an impact, the first, second, and third insulating films 181-183 of the insulating film 180 are disposed in the order of the third insulating film 183 contacting the interlayer insulating film 160, the second insulating film 182, and the first insulating film 181.

Since a portion contacting the interlayer insulating film 160 in the first region is the second insulating film 182 having a low modulus, an external impact is not transmitted to the interlayer insulating film 160 via the second insulating film 182.

Since a portion contacting the interlayer insulating film 160 in the second region is the third insulating film 183 having a high modulus, an external impact is transmitted to the interlayer insulating film 160 via the third insulating film 183. However, since the second region is a region not overlapping a transistor or the like, even if an impact is transmitted to the interlayer insulating film 160 and a crack occurs, the crack is not viewed as a defect.

Figure 8:
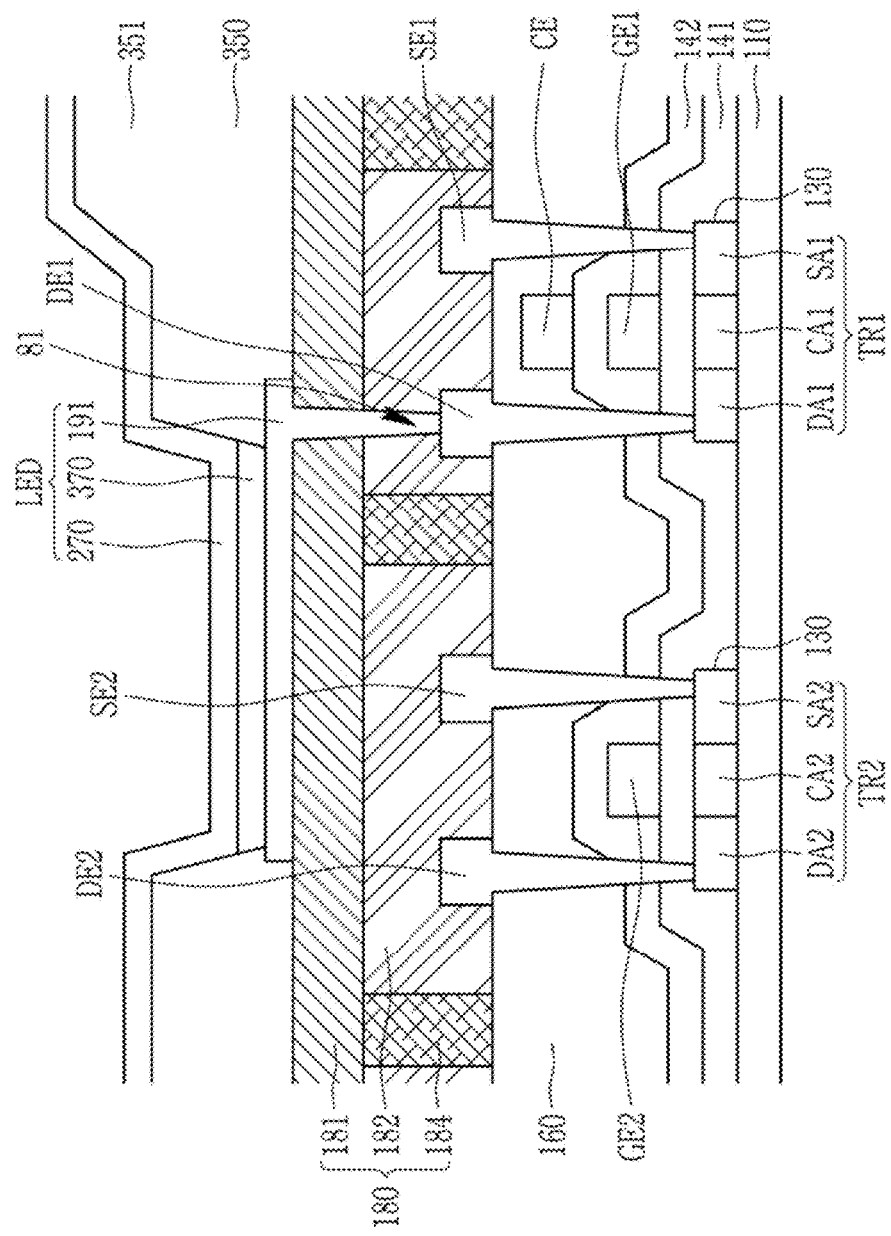
FIG. 8 illustrates a cross-sectional view of a display device according to another exemplary embodiment of the present invention that illustrates the same cross-section as in FIG. 1.

FIG. 8 illustrates a cross-sectional view of a display device according to another exemplary embodiment of the present invention that illustrates the same cross-section as in FIG. 1. Except for the structure of the insulating film 180, the display device of FIG. 8 is the same as the display device of FIG. 1. A detailed description of the same components may be omitted.

In FIG. 8, a fourth insulating film 184 disposed between the second insulating films 182 spaced apart from each other is included.

The modulus of the first insulating film 181 is larger than that of the second insulating film 182. The modulus of the first insulating film 181 may be 80 GPa to 150 GPa, and the modulus of the second insulating film 182 may be 5 GPa to 10 GPa.

The modulus of the fourth insulating film 184 is larger than that of the second insulating film 182 and smaller than that of the first insulating film 181. In other words, the fourth insulating film 184 has a modulus between the moduli of the second insulating film 182 and the first insulating film 181. The fourth insulating film 184 may include an organic material or an inorganic material. The modulus of the fourth insulating film 184 may be 2 to 30 times that of the second insulating film.

Referring to FIG. 8, the second insulating film 182 and the fourth insulating film 184 may have the same height. Accordingly, the first insulating film 181 may be disposed on a flat surface. Since the first insulating film 181 includes an inorganic material, the first insulating film 181 may not be formed on a curved or grooved surface. However, the display device of FIG. 8 may easily form the first insulating film 181 because a flat surface is formed when a space between the second insulating films 182 spaced apart from each other is filled with the fourth insulating film 184.

The second insulating film 182 overlaps the first and second transistors TR1 and TR2, and the fourth insulating film 184 does not overlap the first and second transistors TR1 and TR2 and the like. Since the modulus of the fourth insulating film 184 is higher than that of the second insulating film 182, an external impact is transmitted to the fourth insulating film 184. This impact is transmitted to an underlying structure of the fourth insulating film 184. However, since no transistor or the like is disposed under the fourth insulating film 184, even if a crack due to the impact occurs, it is not viewed as a defect.

As described above, in the display device according to an exemplary embodiment of the present invention, the insulating films having different moduli are disposed in the first region overlapping the transistor and the second region not overlapping the transistor. In this case, the second insulating film 182 having a low modulus contacts the first region overlapping the transistor, and the first insulating film 181 (the third insulating film 183 or the fourth insulating film 184) having a high modulus contacts the second region overlapping the transistor. Therefore, the external impact is transmitted to a lower portion of the second region. Therefore, structures such as the transistors disposed under the first region are protected and the bright spot failure is prevented.

As described above, the configuration in which the modulus of the insulating film disposed in the first region overlapping the transistor is smaller than that of the insulating film disposed in the second region not overlapping the transistor may be applied to display devices having various structures. For example, as long as the moduli of the insulating films disposed in the first region and the second region are different, the present invention is not limited to a specific structure.

Hereinafter, an example of the display device to which the above-described structure is applied will be described in detail with reference to the accompanying drawings.

Figure 9:
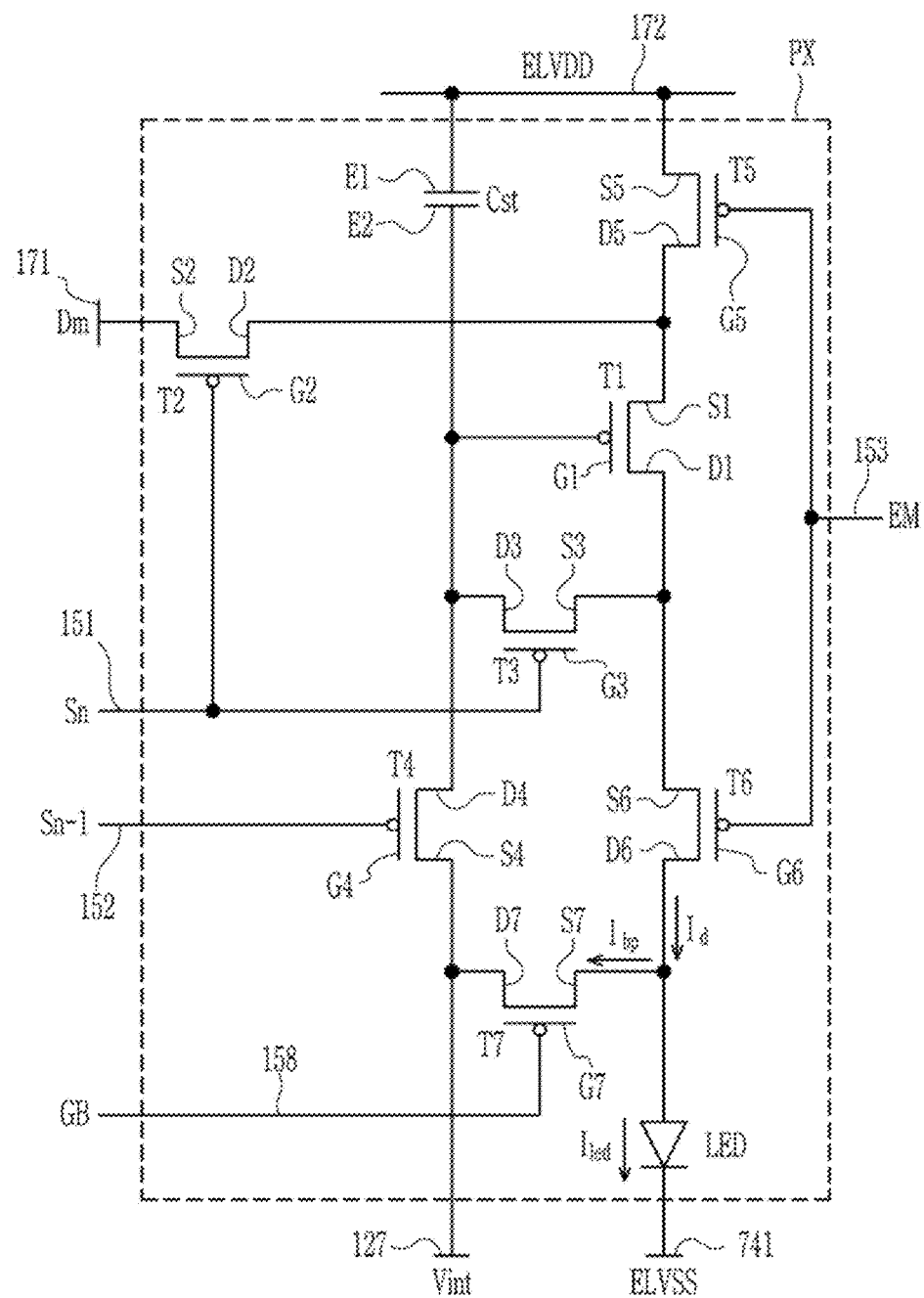
FIG. 9 illustrates an equivalent circuit diagram of a pixel of a light emitting diode display device according to an exemplary embodiment of the present invention.
Figure 10:
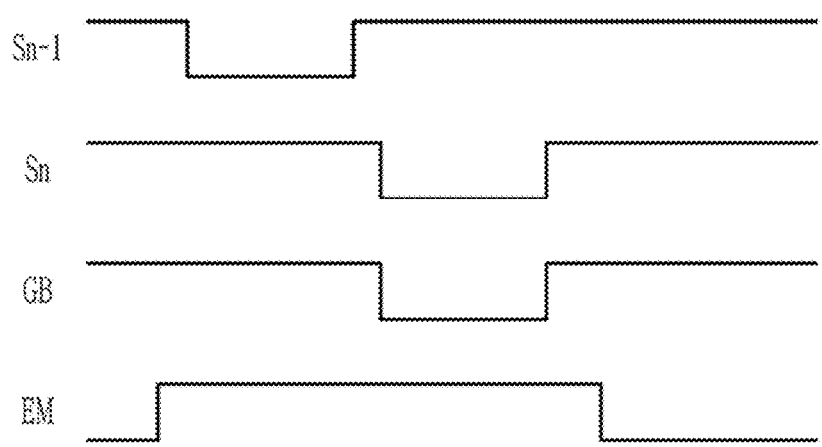
FIG. 10 illustrates a timing chart of a signal applied to a pixel of a light emitting diode display device according to an exemplary embodiment of the present invention.

FIG. 9 illustrates an equivalent circuit diagram of a pixel of a light emitting diode display device according to an exemplary embodiment of the present invention, and FIG. 10 illustrates a timing chart of a signal applied to a pixel of a light emitting diode display device according to an exemplary embodiment of the present invention.

Referring to FIG. 9, a pixel PX of a light emitting diode display device includes a plurality of transistors T1, T2, T3, T4, T5, T6, and 17 connected to a plurality of signal lines 127, 151, 152, 153, 158, 171, 172, and 741, a storage capacitor Cst, and a light emitting diode LED.

The light emitting diode display device includes a display area in which an image is displayed, and the pixels PX are arranged in various shapes in the display area.

The plurality of transistors T1, T2, T3, T4, T, T6, and T7 include a driving transistor T1, switching transistors connected to a first scan line 151, in other words, a second transistor T2 and a third transistor T3, and compensating transistors for performing operations required to drive the light emitting diode LED. The compensating transistors T4, T5, T6, and T7 may include a fourth transistor T4, a fifth transistor T5, a sixth transistor T6, and a seventh transistor T7.

The plurality of signal lines 127, 151, 152, 153, 158, 171, 172 and 741 may include the first scan line 151, a second scan line 152, a light emitting control line 153, a bypass control line 158, a data line 171, a driving voltage line 172 an initializing voltage line 127, and a common voltage line 741. The bypass control line 158 may be a part of the second scan line 152 or may be electrically connected thereto.

The first scan line 151 is connected to a gate driver to transmit a scan signal Sn to the second transistor T2 and the third transistor T3. The second scan line 152 is connected to the gate driver and transmits a front scan signal Sn−1 applied to the pixel PX disposed at a previous stage thereof to the fourth transistor T4. The light emitting control line 153 is connected to an emission control portion, and transmits an emission control signal EM for controlling an emission time of the light emitting diode LED to the fifth transistor T5 and the sixth transistor T6. The bypass control line 158 transmits a bypass signal GB to the seventh transistor 7.

The data line 171 is a wire for transmitting a data voltage Dm generated in a data driving portion, and a luminance at which the light emitting diode LED (also referred to as the light emitting element) emits varies in accordance with the data voltage Dm. The driving voltage line 172 applies a driving voltage ELVDD. The initializing voltage line 127 transmits an initializing voltage Vint for initializing the driving transistor T1. The common voltage line 741 applies a common voltage ELVSS. The voltages applied to the driving voltage line 172, the initializing voltage line 127, and the common voltage line 741 may be constant.

Hereinafter, a plurality of transistors will be described.

The driving transistor T1 is a transistor that adjusts a current outputted according to the applied data voltage Dm. An outputted driving current Id is applied to the light emitting diode LED to adjust a brightness of the light emitting diode LED according to the data voltage Dm. To accomplish this, a first electrode S1 of the driving transistor T1 is disposed to receive the driving voltage ELVDD. The first electrode S1 is connected to the driving voltage line 172 via the fifth transistor T5. In addition, the first electrode S1 of the driving transistor T1 is connected to a second electrode D2 of the second transistor T2 to receive the data voltage Dm. A second electrode D1 (e.g., an output electrode) of the driving transistor T1 is disposed to output a current to the light emitting diode LED. The second electrode D1 of the driving transistor T1 is connected to an anode of the light emitting diode LED via the sixth transistor T6. A gate electrode G1 of the driving transistor T1 is connected to one electrode (e.g., a second storage electrode E2) of the storage capacitor Cst. Accordingly, a voltage of the gate electrode G1 varies depending on a voltage stored in the storage capacitor Cst, and thus, the driving current Id outputted by the driving transistor T1 varies.

The second transistor T2 is a transistor for receiving the data voltage Dm provided to the pixel PX. A gate electrode G2 of the second transistor T2 is connected to the first scan line 151, and a first electrode S2 of the second transistor T2 is connected to the data line 171. The second electrode D2 of the second transistor T2 is connected to the first electrode S1 of the driving transistor T1. When the second transistor 12 is turned on according to the first scan signal Sn transmitted through the first scan line 151, the data voltage Dm transmitted through the data line 171 is transmitted to the first electrode S1 of the driving transistor T1.

The third transistor T3 is a transistor that allows a compensation voltage (a voltage of Dm+Vth) in which the data voltage Dm is changed while passing through the driving transistor T1 to be transmitted to the second storage electrode E2 of the storage capacitor Cst. A gate electrode G3 of the third transistor T3 is connected to the first scan line 151, and a first electrode S3 of the third transistor T3 is connected to the second electrode D1 of the driving transistor T1. A second electrode D3 of the third transistor T3 is connected to the second storage electrode E2 of the storage capacitor Cst and the gate electrode G1 of the driving transistor T1. The third transistor T3 connects the gate electrode G1 and the second electrode D1 of the driving transistor T1 according to the scan signal Sn received through the first scan line 151. The third transistor T3 also connects the second electrode D1 of the driving transistor T1 and the second storage electrode E2 of the storage capacitor Cst.

The fourth transistor T4 initializes the gate electrode G1 of the driving transistor T1 and the second storage electrode E2 of the storage capacitor Cst. A gate electrode G4 of the fourth transistor T4 is connected to the second scan line 152, and a first electrode S4 of the fourth transistor T4 is connected to the initializing voltage line 127. A second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transmits the initialization voltage Vint to the gate electrode G1 of the driving transistor T1 and the second storage electrode E2 of the storage capacitor Cst according to the front scan signal Sn−1 received through the second scan line 152. Thus, a gate voltage of the gate electrode G1 of the driving transistor T1 and the storage capacitor Cst are initialized. The initializing voltage Vint has a low voltage value, which may be a voltage capable of turning on the driving transistor T1.

The fifth transistor T5 transmits the driving voltage ELVDD to the driving transistor T1. A gate electrode G5 of the fifth transistor T5 is connected to the light emitting control line 153, and a first electrode S5 of the fifth transistor T5 is connected to the driving voltage line 172. A second electrode D5 of the fifth transistor T5 is connected to the first electrode S1 of the driving transistor T1.

The sixth transistor T6 transmits the driving current Id outputted from the driving transistor T1 to the light emitting diode LED. A gate electrode G6 of the sixth transistor T6 is connected to the light emitting control line 153, and a first electrode S6 of the sixth transistor T6 is connected to the second electrode D1 of the driving transistor T1. A second electrode D6 of the sixth transistor T6 is connected to the anode of the light emitting diode LED.

The fifth transistor T5 and the sixth transistor T6 are simultaneously turned on by the light emitting control signal EM received through the light emitting control line 153, and when the driving voltage ELVDD is applied to the first electrode S1 of the driving transistor T1 through the fifth transistor T5, the driving transistor T1 outputs the driving current Id according to a voltage (e.g., a voltage of the second storage electrode E2 of the storage capacitor Cst) of the gate electrode G1 of the driving transistor T1. The outputted driving current Id is transmitted to the light emitting diode LED through the sixth transistor T6. The light emitting diode LED emits light as a current $I_{led}$ flows therethrough.

The seventh transistor T7 initializes the anode of the light emitting diode LED. A gate electrode G7 of the seventh transistor T7 is connected to the bypass control line 158, a first electrode S7 of the seventh transistor T7 is connected to the anode of the light emitting diode OLED, and a second electrode D7 of the seventh transistor 17 is connected to the initializing voltage line 127. The bypass control line 158 may be connected to the second scan line 152 and the bypass signal GB may be the same timing signal as the front scan signal Sn−1. In addition, the bypass control line 158 may not be connected to the second scan line 152 and may transmit a separate signal that is different from the front scan signal Sn−1. When the seventh transistor T7 is turned on by the bypass signal GB, the initialization voltage Vint is applied to the anode of the light emitting diode LED to initialize the light emitting diode LED.

A first storage electrode E1 of the storage capacitor Cst is connected to the driving voltage line 172 and the second storage electrode E2 of the storage capacitor Cst is connected to the gate electrode G1 of the driving transistor T1, the second electrode D3 of the third transistor 13, and the second electrode D4 of the fourth transistor T4. As a result, the second storage electrode E2 determines the voltage of the gate electrode C1 of the driving transistor T1, and receives the data voltage Dm through the second electrode D3 of the third transistor T3, or receives the initializing voltage Vint through the second electrode D4 of the fourth transistor T4.

The anode of the light emitting diode LED is connected to the second electrode D6 of the sixth transistor T6 and the first electrode S7 of the seventh transistor 17, and a cathode of the light emitting diode LED is connected to the common voltage line 741 for transmitting the common voltage ELVSS.

In the exemplary embodiment of FIG. 9 the pixel circuit includes the seven transistors T1 to T7 and the one capacitor Cst, but it is not limited thereto. For example, the number of transistors and the number of capacitors and their connections may be variously changed.

An operation of a pixel of the light emitting diode display device according to an exemplary embodiment of the present invention will be described with reference to FIG. 9 and FIG. 10.

During an initialization period, the front scan signal Sn−1 of a low level is supplied to the pixel PX through the second scan line 152. In this case, the fourth transistor T4 to which the front scan signal Sn−1 of the low level is applied is turned on. Therefore, the initialization voltage Vint is applied to the gate electrode G1 of the driving transistor T1 and the second storage electrode E2 of the storage capacitor Cst through the fourth transistor T4. Accordingly, the driving transistor T1 and the storage capacitor Cst are initialized. A voltage of the initialization voltage Vint is low such that the driving transistor T1 may be turned on.

Thereafter, the bypass signal GB of the low level is applied to the seventh transistor T7. The seventh transistor T7 to which the bypass signal GB of the low level is applied is turned on. Therefore, the initialization voltage Vint is applied to the anode of the light emitting diode LED through the seventh transistor 17. Accordingly, the anode of the light emitting diode LED is initialized.

During a data writing period, the scan signal Sn of a low level is supplied to the pixel PX through the first scan line 151. The second transistor T2 and the third transistor T3 are turned on by the scan signal Sn of the low level.

When the second transistor T2 is turned on, the data voltage Dm is inputted to the first electrode S1 of the driving transistor T1 through the second transistor 12.

In addition, during the data writing period, the third transistor T3 is turned on, so that the second electrode D1 of the driving transistor T1 is electrically connected to the gate electrode G1 and the second storage electrode E2 of the storage capacitor Cst. The gate electrode G1 of the driving transistor T1 and the second electrode D1 are diode-connected. Further, since the low voltage (e.g., the initialization voltage Vint) is applied to the gate electrode G1 during the initialization period, the driving transistor T1 is in a turned-on state. Accordingly, the data voltage Dm inputted to the first electrode S1 of the driving transistor T1 is outputted from the second electrode D1 through a channel of the driving transistor T1, and then, is stored in the second storage electrode E2 of the storage capacitor Cst through the third transistor T3.

In this case, the voltage applied to the second storage electrode E2 is changed according to a threshold voltage Vth of the driving transistor T1, the data voltage Dm is applied to the first electrode S1 of the driving transistor T, and when the initialization voltage Vint is applied to the gate electrode G1 of the driving transistor T1, a voltage outputted in the second electrode D1 may be 'Vgs+Vth'. Here, for example, Vgs is a difference between voltages applied to the gate electrode G1 and the first electrode S1 of the driving transistor T1, thus Vg may be 'Dm−Vint'. Therefore, the voltage that is outputted from the second electrode D1 and stored in the second storage electrode E2 may be 'Dm−Vint+Vth'.

Thereafter, during a light emitting period, since the light emitting control signal EM supplied from the light emitting control line 153 is a low level, the fifth transistor T5 and the sixth transistor T6 are turned on. As a result, the driving voltage ELVDD is applied to the first electrode S1 of the driving transistor T1, and the second electrode D1 of the driving transistor T1 is connected to the light emitting diode LED. The driving transistor T1 outputs the driving current Id according to a difference between the voltage of the gate electrode G1 and the voltage (e.g., the driving voltage ELVDD) of the first electrode S1. The driving current Id of the driving transistor T1 may have a value proportional to a squared value of 'Vgs−Vth'. Here, for example, Vgs is a difference between voltages applied to both terminals of the storage capacitor Cst, and since Vgs is 'Vg−Vs', Vgs may be 'Dm−Vint+Vth−ELVDD'. Here, for example, when 'Vgh−Vth' is obtained by subtracting Vth, Vgs is 'Dm−Vint−ELVDD'. In other words, the driving current Id of the driving transistor T1 may be a current which is independent of a threshold voltage Vth of the driving transistor T1.

Therefore, it is possible to output an output current of the driving transistor T1 to be constant even though the driving transistors T1 disposed in respective pixels PX have different threshold voltages Vth due to process dispersion, thereby the characteristics of the driving transistors may become more uniform.

In the above formulas, when the transistor is a p-type transistor using a polycrystalline semiconductor, Vth may be a value that is slightly larger than 0 or a negative value. In addition, signs of + and − may be changed depending on a direction in which the voltage is calculated. However, even in this case, the driving current Id which is an output current of the driving transistor T1 may have a value that is independent of the threshold voltage Vth.

When the above-described light emitting period ends, the same operation may be repeated from the initialization period.

One of the first electrode and the second electrode of each of the plurality of transistors T1, T2, T3, T4, 15, T6, and T7 may be a source electrode and the other thereof may be a drain electrode, depending on a direction in which a voltage or current is applied.

In some exemplary embodiments of the inventive concept, while the seventh transistor 17 initializes the anode of the light emitting diode LED in the initialization period, it may prevent even a small amount of current emitted under a condition in which the driving transistor T1 is not actually turned on from flowing to the light emitting diode LED. In this case, the small amount of current is discharged through the seventh transistor T7 to a terminal of the initialization voltage Vint stage as a bypass current Ibp. Accordingly, the light emitting diode LED does not emit unnecessary light, so that a black gradation may be displayed more clearly and a contrast ratio may be improved. In this case, the bypass signal GB may be a signal having a different timing from that of the front scan signal Sn−1. In some exemplary embodiments of the present invention, the seventh transistor 17 may be omitted.

Figure 11:
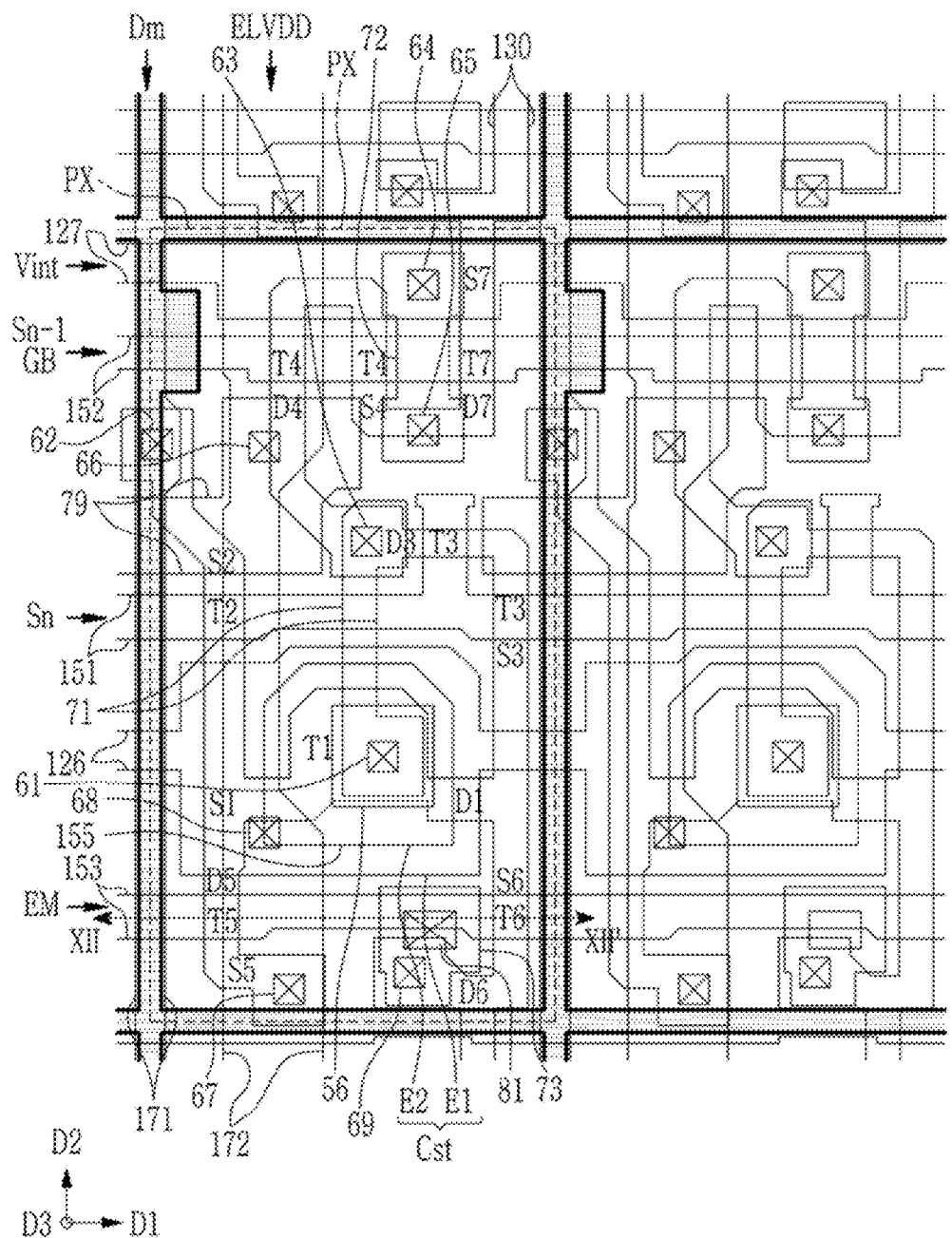
FIG. 11 illustrates a top plan view of a partial region of a light emitting diode display device according to an exemplary embodiment of the present invention.
Figure 12:
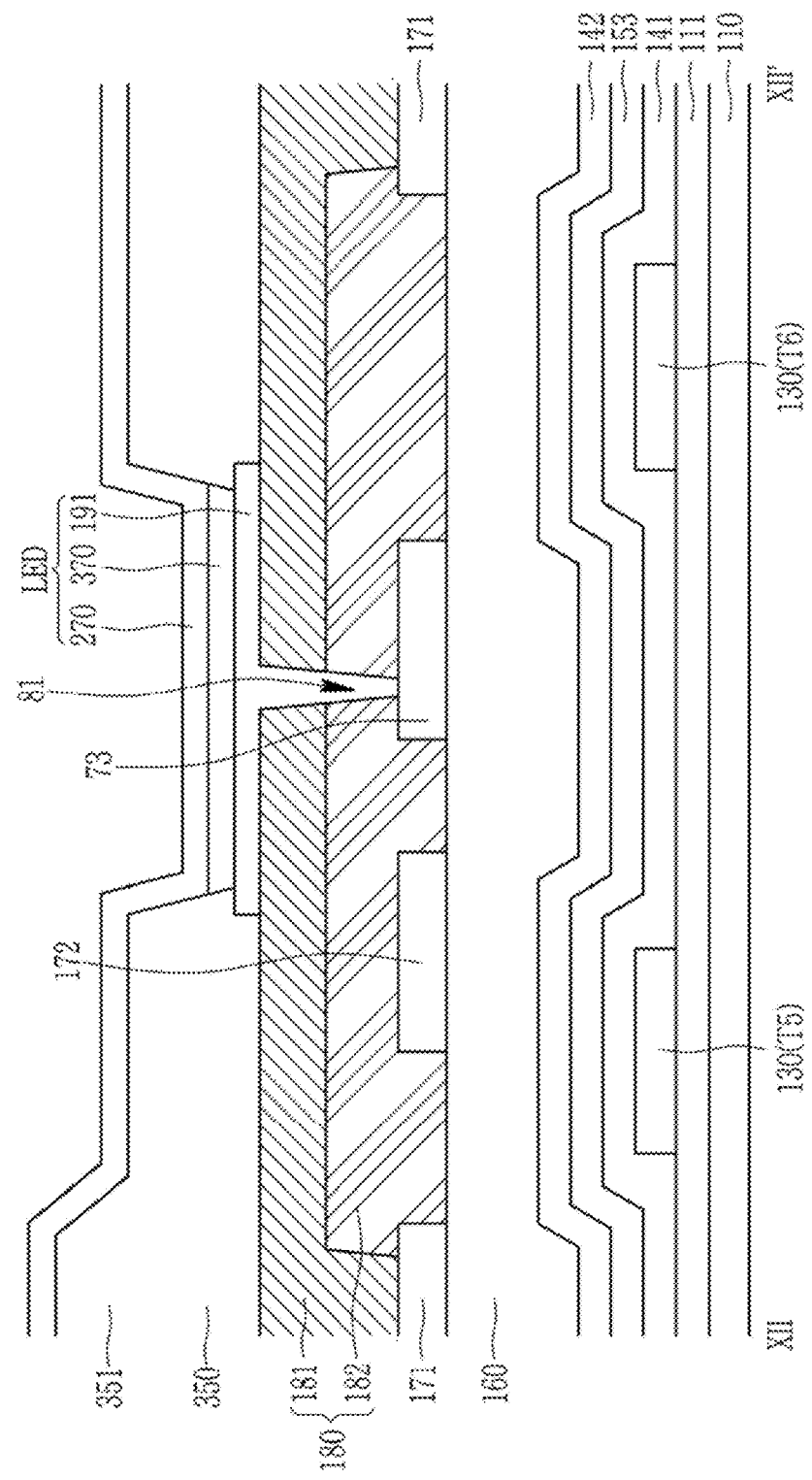
FIG. 12 illustrates a cross-sectional view taken along line XII-XII' of FIG. 11.
Figure 13:
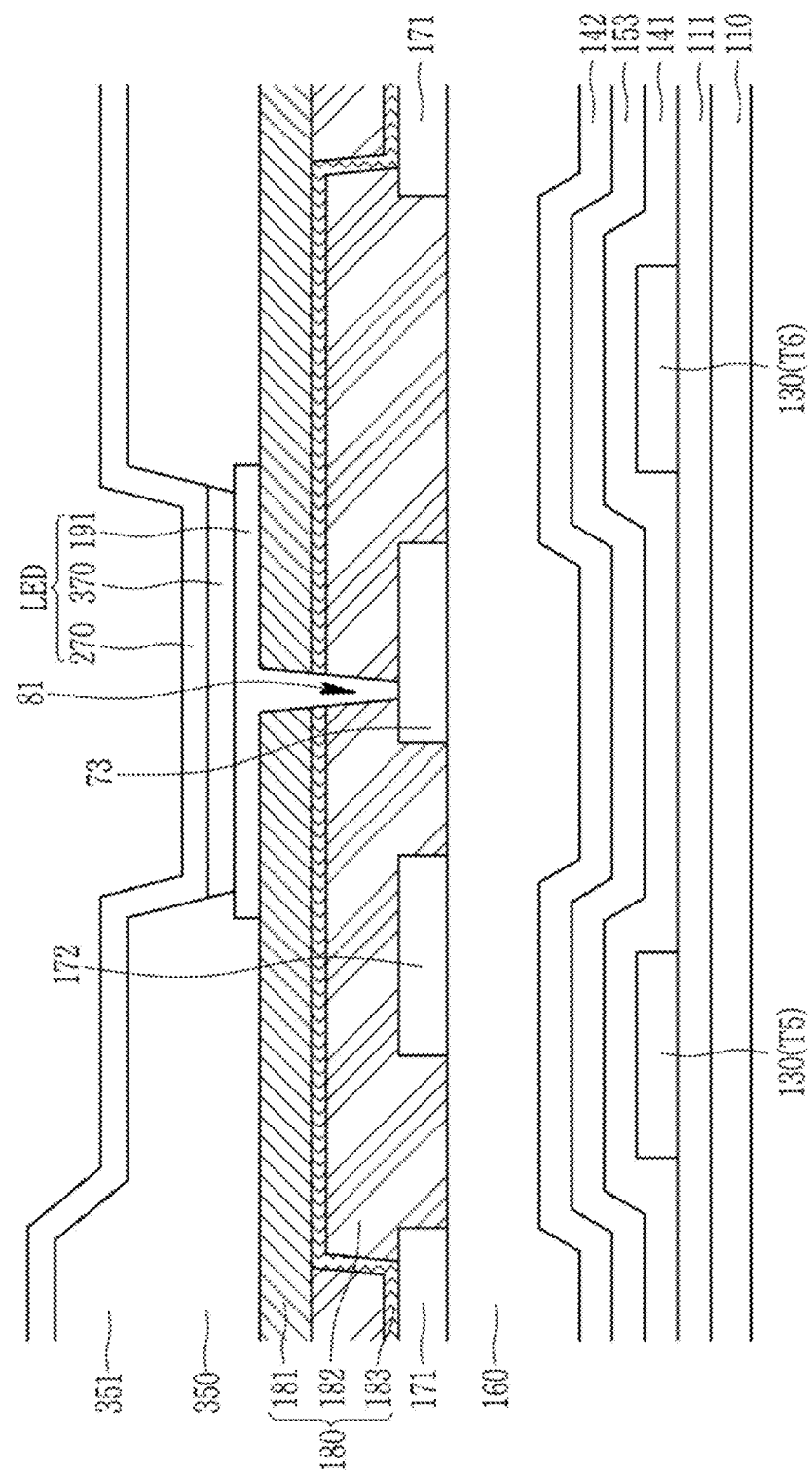
FIG. 13 and FIG. 14 illustrate cross-sectional views of another exemplary embodiment of the present invention that illustrate the same cross-section as in FIG. 12.
Figure 14:
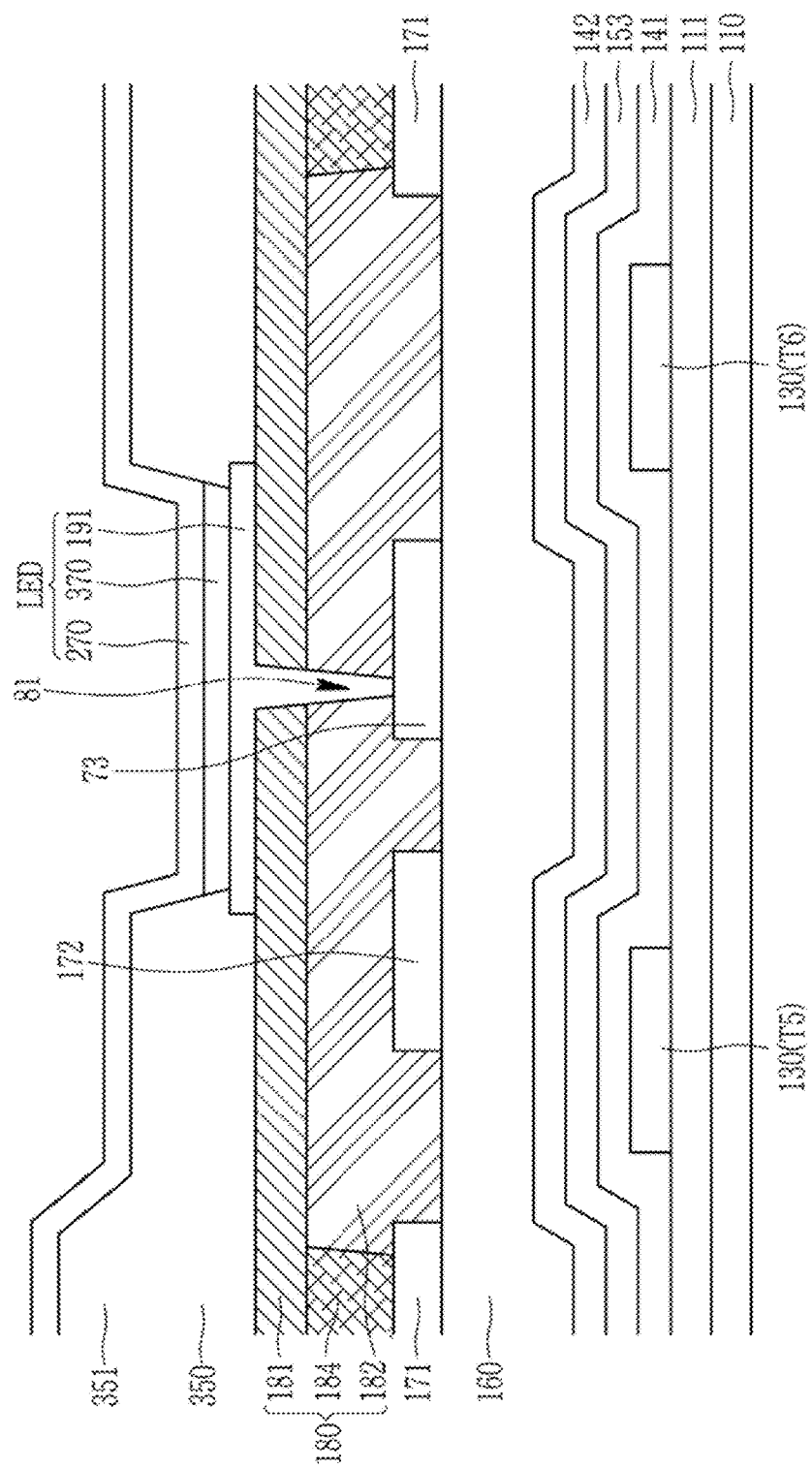

Hereinafter, a pixel structure of a light emitting diode display device according to an exemplary embodiment of the present invention will be described with reference to FIG. 11 to FIG. 14. FIG. 11 illustrates a top plan view of a partial region of a light emitting diode display device according to an exemplary embodiment of the present invention, and FIG. 12 illustrates a cross-sectional view taken along line XII-XII' of FIG. 11. FIG. 13 and FIG. 14 illustrate cross-sectional views of another exemplary embodiment of the present invention that illustrates the same cross-section as in FIG. 12.

Referring to FIG. 11, the light emitting diode display device according to the present exemplary embodiment includes the first scan line 151 extending along a first direction D1 and transmitting the scan signal Sn, the second scan line 152 for transmitting the front scan signal Sn-1, the light emitting control line 153 for transmitting the light emission control signal EM, and the initializing voltage line 127 for transmitting the initialization voltage Vint. The bypass signal GB is transmitted through the second scan line 152.

The light emitting diode display device includes the data line 171 extending along a second direction D2 perpendicular to the first direction D1 and transmitting the data voltage Dm, and the driving voltage line 172 for transmitting the driving voltage ELVDD.

The light emitting diode display device includes the driving transistor T1, the second transistor T2, the third transistor T3, the fourth transistor T4, the fifth transistor T5, the sixth transistor T6, the seventh transistor 17, the storage capacitor Cst, and the light emitting diode LED.

A channel of each of the driving transistor T1, the second transistor T2 the third transistor T3, the fourth transistor T4, the fifth transistor T5, the sixth transistor T6, and the seventh transistor T7 is disposed in the semiconductor layer 130 extending lengthwise. In addition, at least some of the first and second electrodes of the plurality of transistors T1, T2, T3, T4, T5, T6, and 17 are also disposed in the semiconductor layer 130. The semiconductor layer 130 may be formed to have various bent shapes. The semiconductor layer 130 may include a polycrystalline semiconductor such as polysilicon, or an oxide semiconductor.

The semiconductor layer 130 includes a channel doped with n-type impurities or p-type impurities, and a first doped region and a second doped region that are disposed at opposite sides of the channel have a higher doping concentration than that of the impurities doped in the channel. The first doped region and the second doped region respectively correspond to the first electrodes and the second electrodes of the plurality of transistors T1, T2, T3, T4, T5, T6, and T7. When one of the first doped region and the second doped region is a source region, the other is a drain region. In addition, in the semiconductor layer 130, regions between the first and second electrodes of two different transistors are also doped, so that the two transistors may be electrically connected to each other.

Each of the channels of the plurality of transistors T1, T2, T3, T4, T5, T6, and T7 overlaps the gate electrode of its respective one of the transistors T1, T2, T3, T4, T5, T6, and T7, and is disposed between the first electrode and the second electrode of its respective one of the transistors T1, T2 T3, T4, T5, T6, and T7. The plurality of transistors T1, T2, T3, T4, T5, T6, and T7 may have substantially the same stacked structure. Hereinafter, the driving transistor T will be mainly described in detail, and the other transistors T2, T3, T4, T5, T6, and T7 will be briefly described.

The driving transistor T1 includes a channel, a first gate electrode 155, the first electrode S1, and the second electrode D. The channel of the driving transistor T1 is between the first electrode S1 and the second electrode D1, and overlaps the first gate electrode 155 in a plan view. The channel is curved to form a long channel in a limited region. A driving range of the gate voltage Vg applied to the first gate electrode 155 of the driving transistor T1 is widened as a length of the channel increases, and the driving current Id steadily increases in accordance with the gate voltage Vg. Accordingly, a gray of light emitted from the light emitting diode LED may be finely controlled by changing the gate voltage Vg, and the display quality of the light emitting diode display device may be improved. In addition, since the channel extends in several directions rather than extending in one direction, effects due to directionality are offset in a manufacturing process, thereby reducing an effect of process dispersion. Therefore, it is possible to prevent degradation in image quality such as spot defects (for example, a luminance difference occurring depending on pixels even if the same data voltage Dm is applied) which occur due to the characteristic(s) of the driving transistor T that is varied depending on its region in the display device due to the process dispersion. The shape of the channel is not limited to the illustrated horseshoe shape (Ω shape), and the channel may have various shapes.

The first gate electrode 155 may overlap the channel in a plan view. The first and second electrodes S1 and D1 are disposed at opposite sides of the channel. An extended portion of a storage line 126 is isolated and disposed on the first gate electrode 155. The extended portion of the storage line 126 overlaps the gate electrode 155 with a second gate insulating film therebetween in a plan view to form the storage capacitor Cst. The extended portion of the storage line 126 is a first storage electrode (E1 of FIG. 9) of the storage capacitor Cst, and the first gate electrode 155 is a second storage electrode (E2 of FIG. 9). The extended portion of the storage line 126 is provided with an opening 56 so that the gate electrode 155 may be connected to a first data connecting member 71. In the opening 56, an upper surface of the first gate electrode 155 and the first data connecting member 71 are electrically connected through a contact opening 61. The first data connecting member 71 is connected to the second electrode D3 of the third transistor T3 to connect the gate electrode 155 of the driving transistor T1 and the second electrode D3 of the third transistor T3.

The gate electrode of the second transistor T2 may be a portion of the first scan line 151. The data line 171 is connected to the first electrode S2 of the second transistor T2 through a contact opening 62. The first electrode S2 and the second electrode D2 may be disposed on the semiconductor layer 130.

The third transistor T3 may be configured of two transistors adjacent to each other. In the pixel PX of FIG. 11, 3 is illustrated at a left side and a lower side with respect to the bent portion of the semiconductor layer 130. These two portions serve as the third transistor T3, and the first electrode S3 of one third transistor T3 is connected to the second electrode D2 of the other third transistor T3. The gate electrodes of the two transistors T3 may be a part of the first scan line 151 or a part protruding upward from the first scan line 151. Such a structure may be a dual gate structure and may block a leakage current from flowing. The first electrode S3 of the third transistor T3 is connected to the first electrode S6 of the sixth transistor T6 and the second electrode D1 of the driving transistor T1. The second electrode D3 of the third transistor T3 is connected to the first data connecting member 71 through a contact opening 63.

The fourth transistor T4 includes two fourth transistors T4, and the two fourth transistors T4 are formed at a position at which the second scan line 152 and the semiconductor layer 130 meet. The gate electrode of the fourth transistor T4 may be a part of the second scan line 152. The first electrode S4 of one fourth transistor T4 is connected to the second electrode D4 of the other fourth transistor T4. Such a structure may be a dual gate structure and may block a leakage current. A second data connecting member 72 is connected to the first electrode S4 of the fourth transistor T4 through a contact opening 65, and the first data connecting member 71 is connected to the second electrode D2 of the fourth transistor T4 through the contact opening 63.

As described above, the third transistor 3 and the fourth transistor T4 may have the dual gate structure to prevent a leakage current from being generated by blocking an electron movement path of a channel in an off state.

The gate electrode of the fifth transistor T5 may be a part of the light emitting control line 153. The driving voltage line 172 is connected to the first electrode S5 of the fifth transistor T5 through a contact opening 67, and the second electrode D5 is connected to the first electrode S1 of the driving transistor T through the semiconductor layer 130.

The gate electrode of the sixth transistor T6 may be a part of the light emitting control line 153. A third data connecting member 73 is connected to the second electrode D6 of the sixth transistor T6 through a contact opening 69, and the first electrode S6 is connected to the second electrode D1 of the driving transistor T1 through the semiconductor layer 130.

The gate electrode of the seventh transistor T7 may be a part of the second scan line 152. The first electrode S7 of the seventh transistor T7 is connected to the second electrode D6 of the sixth transistor T6, and the second electrode D7 is connected to the first electrode S4 of the fourth transistor T4.

The storage capacitor Cst includes the first storage electrode E1 and the second storage electrode E2 which overlap each other with the second gate insulating film 142 therebetween. The second storage electrode E2 corresponds to the gate electrode 155 of the driving transistor T1, and the first storage electrode E1 may be the extended portion of the storage line 126. Here, for example, the second gate insulating film 142 becomes a dielectric, and a capacitance is determined by a charge stored in the storage capacitor Cst and a voltage between the first and second storage electrodes E1 and E2. By using the first gate electrode 155 as the second storage electrode E2, the storage capacitor Cst may be formed in a space that is narrowed by the channel of the driving transistor T1 occupying a large area in the pixel.

The driving voltage line 172 is connected to the first storage electrode E1 through a contact opening 68. Accordingly, the storage capacitor Cst stores a charge corresponding to a difference between the driving voltage ELVDD transmitted to the first storage electrode E1 through the driving voltage line 172 and the gate voltage Vg of the first gate electrode 155.

The second data connecting member 72 is connected to the initializing voltage line 127 through an opening 64. An electrode, e.g., a pixel electrode, is connected to the third data connecting member 73 through the contact hole 81.

A parasitic capacitor control pattern 79 may be disposed between dual gate electrodes of the compensation transistor T3. A parasitic capacitor exists in the pixel, and image quality characteristics may change when the voltage applied to the parasitic capacitor is changed. The driving voltage line 172 is connected to the parasitic capacitor control pattern 79 through a contact opening 66. Therefore, it is possible to prevent the image quality characteristic from being changed by applying the driving voltage ELVDD, which is a constant DC voltage, to the parasitic capacitor. The parasitic capacitor control pattern 79 may be formed in a different area from that shown, and a voltage other than the driving voltage ELVDD may be applied thereto.

One end of the first data connecting member 71 is connected to the gate electrode 155 through the contact opening 61, and the other end of the first data connecting member 71 is connected to the second electrode D3 of the third transistor T3 and the second electrode D4 of the fourth transistor T4 through the contact opening 63.

One end of the second data connecting member 72 is connected to the first electrode S4 of the fourth transistor T4 through the contact opening 65, and the other end of the second data connecting member 72 is connected to the initializing voltage line 127 through the contact opening 64.

The third data connecting member 73 is connected to the second electrode of the sixth transistor T6 through the contact opening 69.

Hereinafter, a sectional structure of the light emitting diode display device according to an exemplary embodiment of the present invention will be described with reference to FIG. 12 in addition to FIG. 11.

The light emitting diode display device according to the present exemplary embodiment includes the substrate 110.

The substrate 110 may include a plastic layer and a barrier layer. The plastic layer and the barrier layer may be alternately stacked.

The plastic layer may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), polyarylene ether sulfone, or a combination thereof.

The barrier layer may include a silicon oxide, a silicon nitride, or an aluminum oxide, but is not limited thereto, and may include any inorganic material.

A buffer layer 111 is disposed on the substrate 110. The buffer layer 111 may include an inorganic insulating material such as a silicon oxide, a silicon nitride, or an aluminum oxide, or may include an organic insulating material such as a polyimide acryl.

The semiconductor layer 130 including a channel of the plurality of transistors T1, T2, T3, T4, T5, T6, and T7, the first electrode, and the second electrode is disposed on the buffer layer 111.

The first gate insulating film 141 is disposed on the semiconductor layer 130. The first gate conductor including the first gate electrode 155, the first scan line 151, the second scan line 152 and the light emitting control line 153 is disposed on the first gate insulating film 141.

The second gate insulating film 142 covering the first gate conductor is disposed on the first gate conductor. The first gate insulating film 141 and the second gate insulating film 142 may include an inorganic insulating material such as a silicon nitride, a silicon oxide, and an aluminum oxide, or an organic insulating material.

A second gate conductor including a storage line 126, an initializing voltage line 127, and a parasitic capacitor control pattern 79 is disposed on the second gate insulating film 142.

An interlayer insulating film 160 covering the second gate conductor is disposed on the second gate conductor. The interlayer insulating film 160 may include an inorganic insulating material such as a silicon nitride, a silicon oxide, and an aluminum oxide, or may include an organic insulating material.

A data conductor including the data line 171, the driving voltage line 172, the first data connecting member 71, the second data connecting member 72, and the third data connecting member 73 is disposed on the interlayer insulating film 160. The first data connecting member 71 may be connected to the first gate electrode 155 through the contact opening 61.

The insulating film 180 covering the data conductor is disposed on the data conductor. A description of the insulating film 180 may be the same as that described above. For example, referring to FIG. 12, the insulating film 180 includes a first insulating film 181 and a second insulating film 182 having different moduli. The modulus of the first insulating film 181 is larger than that of the second insulating film 182. The second insulating film 182 overlaps the transistors T1, T2, T3, T4, T5, T6, and T7; however, it is only disposed in certain regions above the substrate 110. For example, the first insulating film 181 overlaps the entire surface of the substrate 110, but the second insulating film 182 may only overlap regions of the substrate 110 corresponding to the transistors T1, T2, T3, T4, T5, T6, and T7. In other words, the insulating film 180 having the structure as described in the embodiment of FIG. 1 is provided is FIG. 12. In this case, when an impact applied to the outside of a display panel of the light emitting diode display device is downwardly transmitted through the portion where the first insulating film 181 is disposed alone, the transistor disposed under the second insulating film 182 may not be damaged.

In FIG. 11, the region in which only the first insulating film 181 is disposed is shown by shading. Referring to FIG. 11, the shaded region in which only the first insulating film 181 is disposed overlaps the data line 171 and an empty space inside the pixel PX. The shaded region may form lines which extend in the first direction D1 and the second direction D2 to form a matrix shape. Accordingly, even if an external impact is transmitted to the lower portion of the first insulating film 181, since damage to the transistor does not occur, the bright spot failure may be prevented.

In FIG. 11, a width of the region in which only the first insulating film 181 is disposed may be 3 µm or more. For example, the width of the region in which only the first insulating film 181 is disposed may be between 3 µm and 10 µm. When the width of the region in which only the first insulating film 181 is disposed is 3 µm or less, sufficient impact dispersion may not be obtained.

A detailed description of the first insulating film 181 and the second insulating film 182 is the same as that described with reference to FIG. 1. A detailed description of the same constituent elements may be omitted, and the description of the structure of the insulating film 180 in FIG. 1 is applied to FIG. 12.

FIG. 13 illustrates a cross-sectional view of another exemplary embodiment of the present invention that illustrates the same cross-section as in FIG. 12. The embodiment of FIG. 13 is similar to the embodiment of FIG. 7 described above. Therefore, the description of the structure of the insulating film 180 in FIG. 7 is also applied to the embodiment of FIG. 13.

For example, the insulating film 180 in FIG. 13 includes the first insulating film 181, the second insulating film 182, and the third insulating film 183. The moduli of the first insulating film 181 and the third insulating film 183 are higher than that of the second insulating film 182.

Referring to FIG. 13, the third insulating film 183 is disposed between the second insulating films 182 that are spaced apart from each other. In other words, the third insulating film 183 contacts the interlayer insulating film 160 and the first insulating film 181 while also contacting the upper surface and the side surface of the second insulating films 182 spaced apart from each other.

In this case, the second insulating film 182 contacts the interlayer insulating film 160 in the region overlapping the transistors T1, T2, T3, T4, T5, T6, and T7. In addition, the third insulating film 183 contacts the interlayer insulating film 160 in the region not overlapping the transistor. In this case, the third insulating film 183 directly contacts the interlayer insulating film 160 without the second insulating film 182 therebetween. In the cross-section of FIG. 13, it is illustrated that the data line 171 is disposed on the interlayer insulating film 160 and contacts the third insulating film 183, but the third insulating film 183 contacts the interlayer insulating film 160 in the other cross-section shown in FIG. 7, for example.

In FIG. 11, the shaded portion is a region in which the third insulating film 183 contacts the interlayer insulating film 160. When the portion not shown by shading in FIG. 11 is referred to as a first region, since a portion of the first region that contacts the interlayer insulating film 160 is the second insulating film 182 having a low modulus, the external impact is not transmitted to the interlayer insulating film 160 under the second insulating film 182.

When the portion shown by shading in FIG. 11 is referred to as the second region, since a portion of the second region that contacts the interlayer insulating film 160 is the third insulating film 183 having a high modulus, the external impact is transmitted to the interlayer insulating film 160 under the third insulating film 183. Since the second region is a region not overlapping the transistor or the like, even if an impact is transmitted to the interlayer insulating film 160 and a crack occurs, the crack is not viewed as a defect.

FIG. 14 illustrates a cross-sectional view of another exemplary embodiment of the present invention that illustrates the same cross-section as in FIG. 12. The embodiment of FIG. 14 is similar to the embodiment of FIG. 8 described above. Therefore, the description of the structure of the insulating film 180 in FIG. 8 is also applied to the embodiment of FIG. 14.

For example, the insulating film in FIG. 14 includes the first insulating film 181, the second insulating films 182 spaced apart from each other, and a fourth insulating film 184 disposed between the second insulating films 182.

The modulus of the first insulating film 181 is larger than that of the second insulating film 182. In addition, the modulus of the fourth insulating film 184 is larger than that of the second insulating film 182 and smaller than that of the first insulating film 181.

The portion shown by shading in FIG. 11 may correspond to the portion where the fourth insulating film 184 is disposed, and the portion not shown by shading in FIG. 11 may correspond to the portion where the second insulating film 182 is disposed.

Referring to FIG. 14, the second insulating film 182 and the fourth insulating film 184 have the same height, and the first insulating film 181 is disposed on a flat surface.

When the portion not shown by shading is referred to as the first region in FIG. 11, since a portion of the first region that contacts the interlayer insulating film 160 is the second insulating film 182 having a low modulus, the external impact is not transmitted to the interlayer insulating film 160 under the second insulating film 182.

When the portion shown by shading in FIG. 11 is referred to as the second region, since a portion of the second region that contacts the interlayer insulating film 160 is the fourth insulating film 184 having a higher modulus than that of the second insulating film 182, the external impact is transmitted to the interlayer insulating film 160 under the fourth insulating film 184. Since the second region is a region not overlapping the transistor or the like, even if an impact is transmitted to the interlayer insulating film 160 and a crack occurs, the crack is not viewed as a defect.

Referring to FIGS. 12-14, the first electrode 191 is disposed on the insulating film 180. The first electrode 191 is connected to the third data connecting member 73 through the contact hole 81 formed in the insulating film 180.

The partition wall 350 is disposed on the insulating film 180 and the first electrode 191. The partition wall 350 has the opening 351 overlapping the first electrode 191. The light emitting layer 370 is disposed in the opening 351. The second electrode 270 is disposed on the light emitting layer 370 and the partition wall 350. The first electrode 191, the light emitting layer 370, and the second electrode 270 form the light emitting diode LED.

In some embodiments of the present invention, the first electrode 191 may be an anode that is a pixel electrode and a hole injecting electrode, and the second electrode 270 may be a cathode that is a common electrode and an electron injecting electrode. In other embodiments of the present invention, the first electrode 191 may a cathode, and the second electrode 270 may be an anode. When holes and electrons are injected into the light emitting layer from the first electrode 191 and the second electrode 270, respectively, light is emitted when excitons, which are generated when the injected holes and electrons are combined, enter a ground state from an excited state.

Various embodiments of the present invention have been described above with reference to the top plan view of FIG. 11, but the present invention is not limited thereto. In other words, in FIG. 11, the region in which the insulating film having a high modulus is disposed to absorb the impact is shown by shading, and the shaded region is shown to cross a portion of the data line 171 and the empty space of the pixel PX, but the present invention is not limited thereto. For example, the region in which the insulating film having a high modulus is disposed may be added to the inside of the pixel PX in an area not overlapping the transistor.

Figure 15:
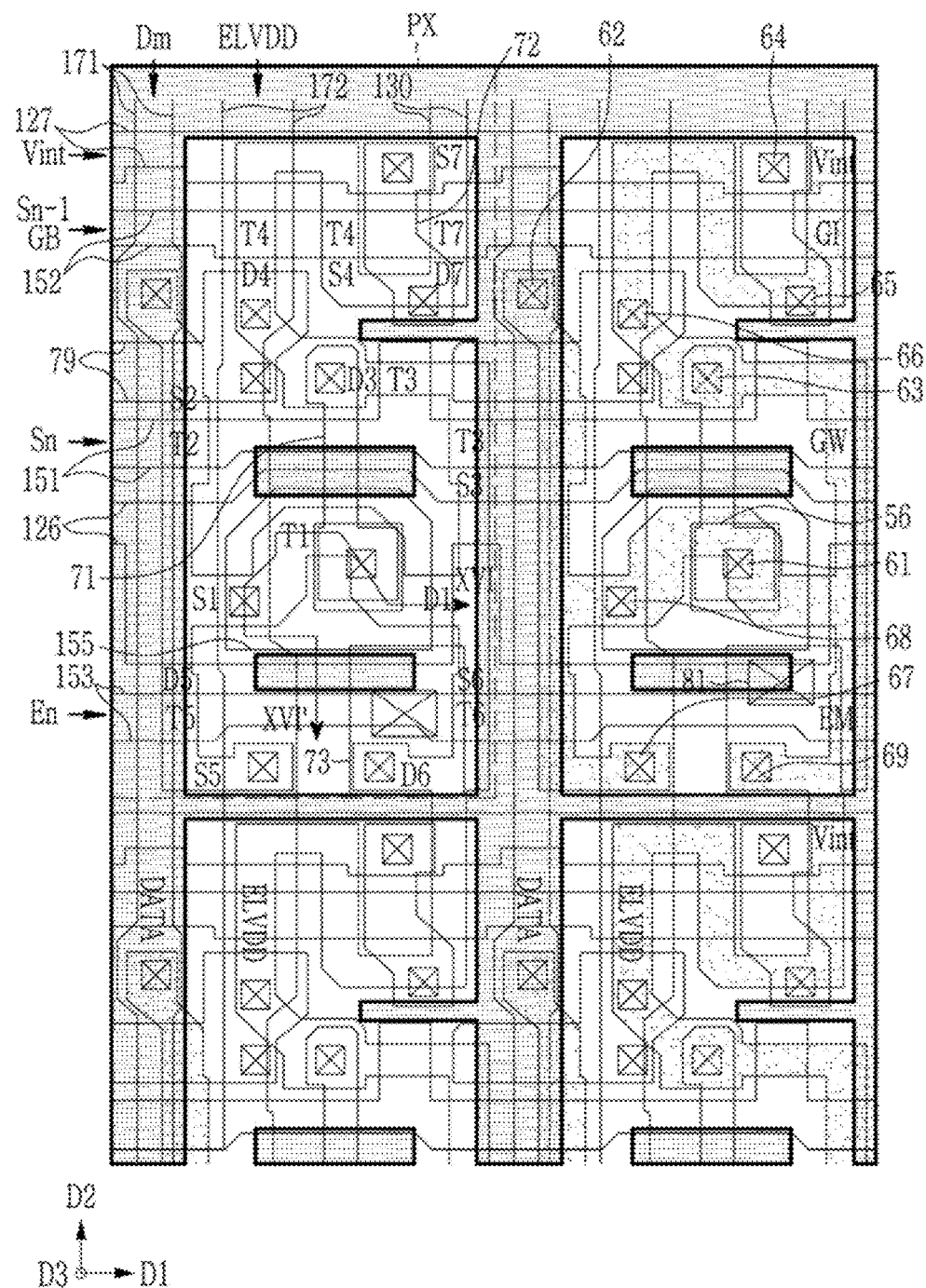
FIG. 15 illustrates the same region as FIG. 11 in a display device according to another exemplary embodiment of the present invention.
Figure 16:
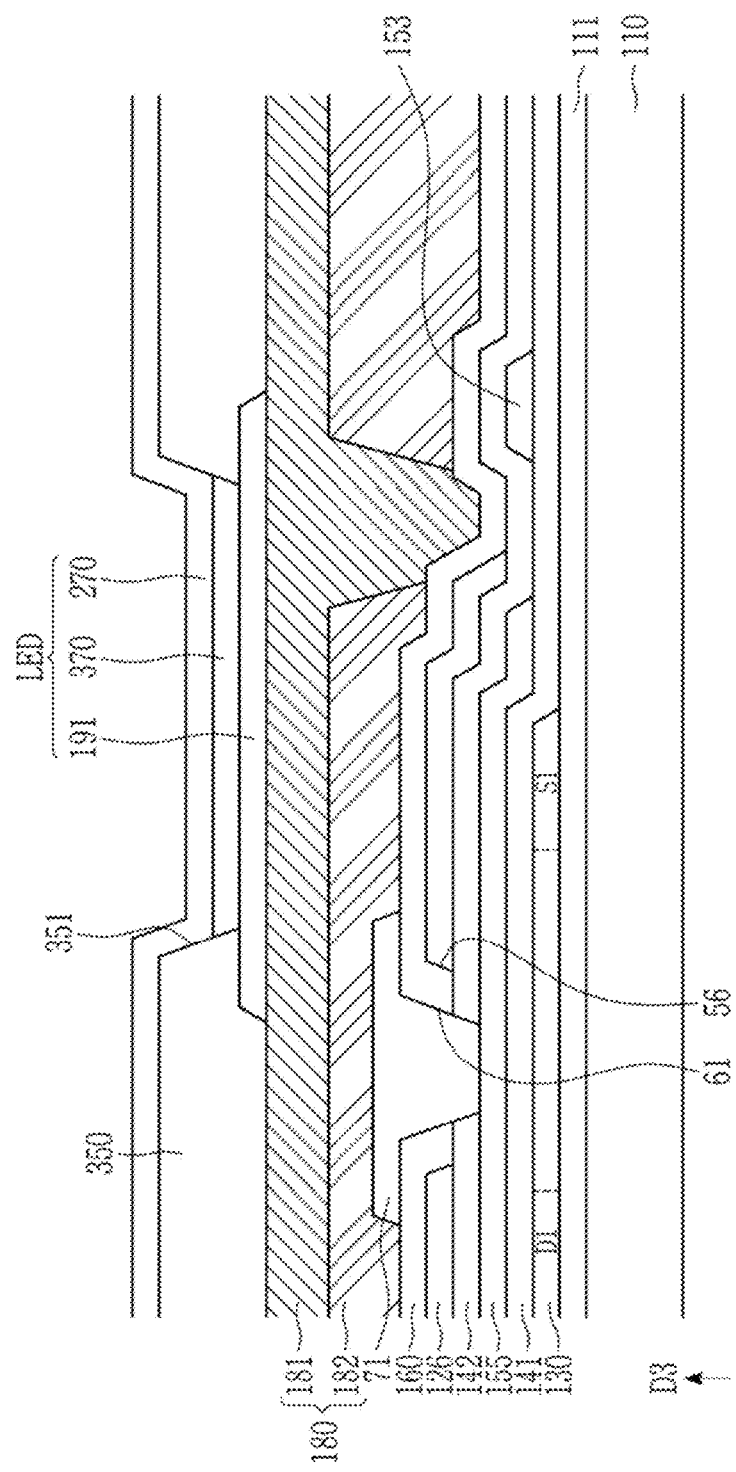
FIG. 16 illustrates a cross-sectional view taken along line XVI-XVI' of FIG. 15.
Figure 17:
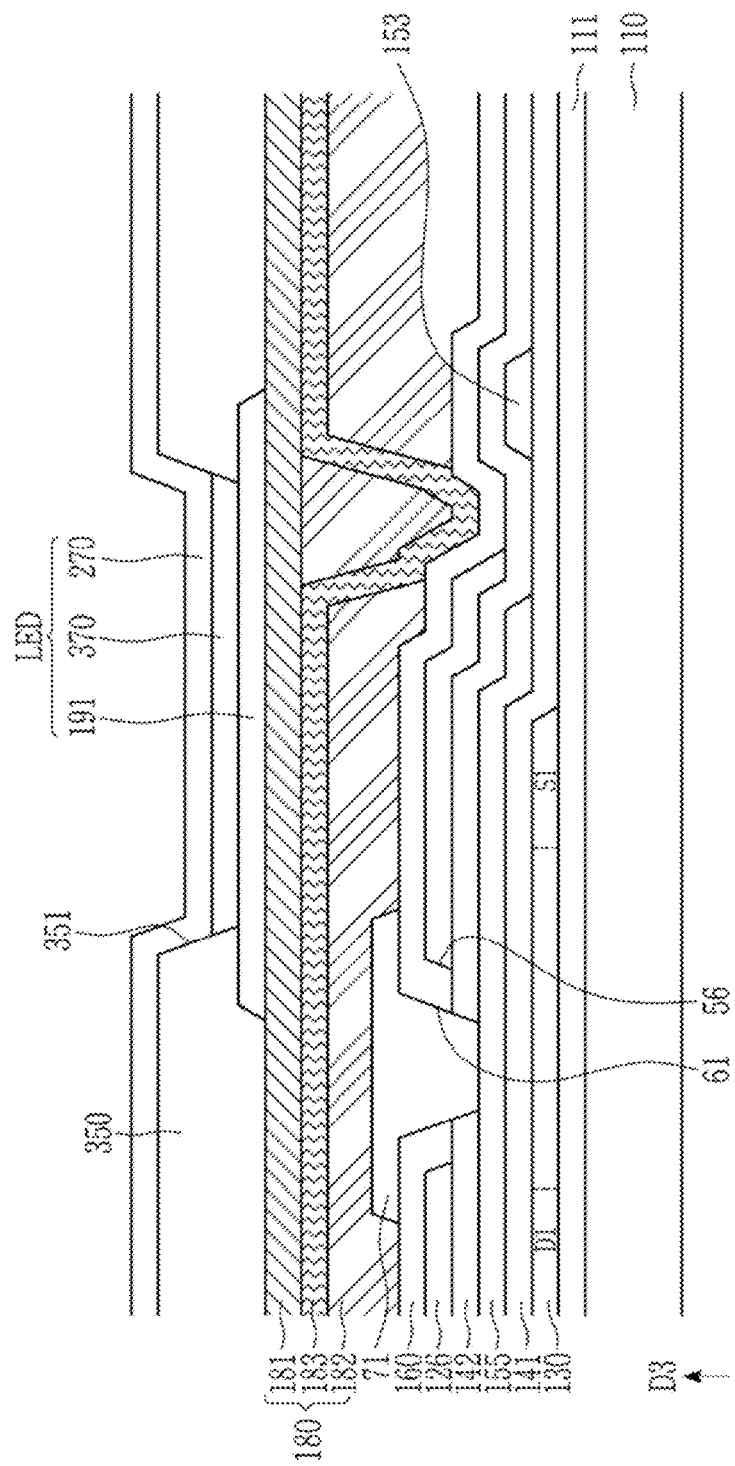
FIG. 17 and FIG. 18 illustrate cross-sectional views of a display device according to another embodiment of the present invention that illustrate the same cross-section as in FIG. 12.
Figure 18:
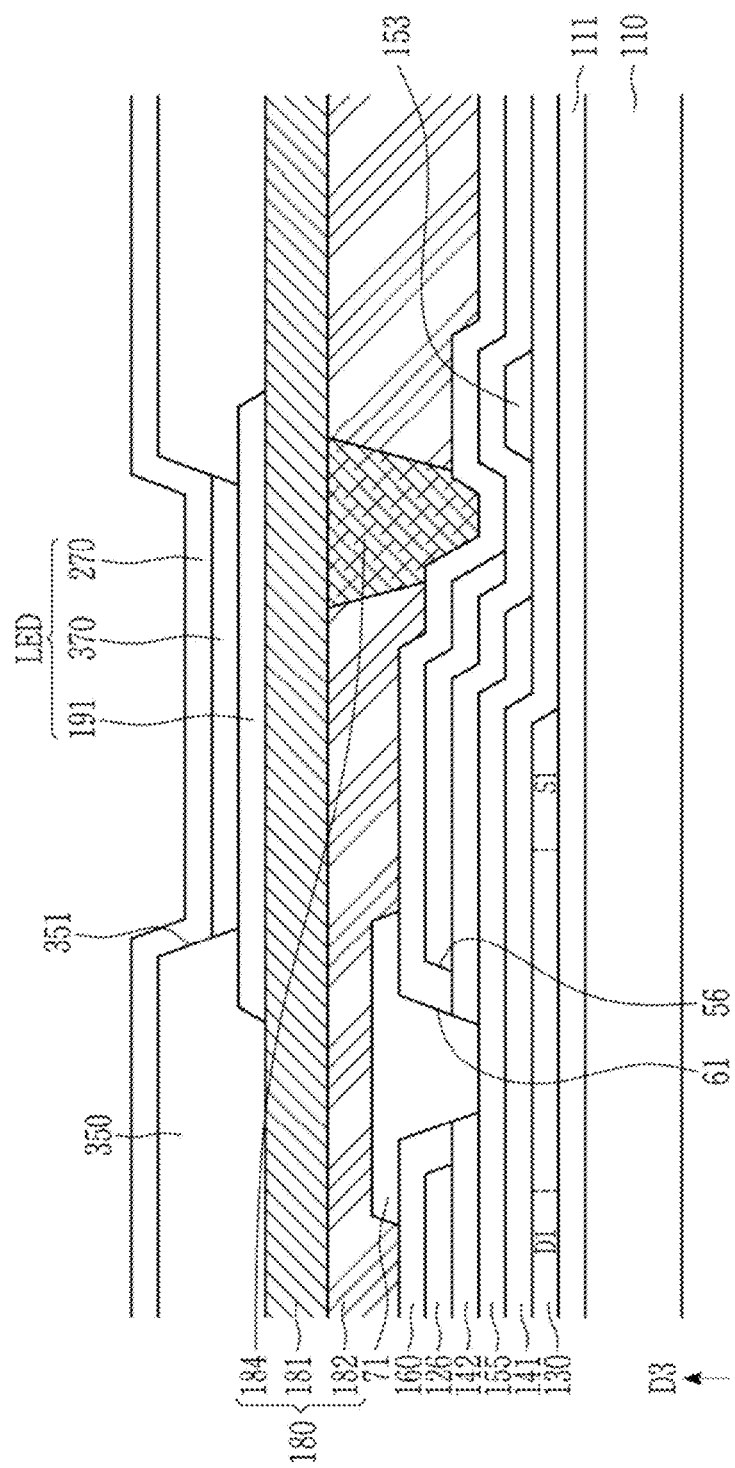

Hereinafter, a display device according to another exemplary embodiment of the present invention will be described. FIG. 15 illustrates the same region as FIG. 11 in a display device according to another exemplary embodiment of the present invention. FIG. 16 illustrates a cross-sectional view taken along line XV-XVI' of FIG. 15. FIG. 17 and FIG. 18 illustrate cross-sectional views of a display device according to another exemplary embodiment of the present invention that illustrate the same cross-section as in FIG. 12.

Referring to FIG. 15, the constituent elements of the display device according to the present embodiment are the same as those in FIG. 11. In other words, the descriptions of the first scan line 151, the second scan line 152, the light emitting control line 153, the initializing voltage line 127, and the transistors T1, T2, T3, T4, T5, T6, and T7 in FIG. 15 are the same as those in FIG. 11. A detailed description of the same components will thus be omitted.

In FIG. 15, the second region in which the impact of the insulating film 180 is transmitted is shown by shading. A portion not shown by shading is the first region, e.g., a region protected from impact by the second insulation film 182. Referring to FIG. 15, the second region overlaps the data line 171 at the edge of the pixel PX and is also disposed in a space inside the pixel PX. In other words, as shown in FIG. 15, the second region is disposed in a portion of the pixel PX that does not overlap a wire or a transistor.

As described above, an insulating film having a higher modulus than that of the insulating film of the first region is disposed in the second region, thereby transmitting an impact applied to the display device. In FIG. 15, a width of the second region may be 3 μm or more. For example, the width of the second region may be between 3 μm and 10 μm. When the width of the second region is 3 μm or less, sufficient impact dispersion may not be obtained.

FIG. 16 illustrates a cross-section of an embodiment similar to the embodiment of FIG. 1 and the embodiment of FIG. 12. A detailed description of the same components will be omitted. In other words, referring to FIG. 16, the insulating film 180 includes the first insulating film 181 and the second insulating film 182 having different moduli. The modulus of the first insulating film 181 is larger than that of the second insulating film 182.

The second insulating film 182 overlaps the transistor, and only the first insulating film 181 is disposed in a space between the transistors. Therefore, the pressure applied to the display device is transmitted to the region in which only the first insulating film 181 is disposed, so that the transistor under the second insulating film 182 may be protected.

FIG. 17 illustrates a cross-section of an embodiment similar to the embodiment of FIG. 8 and the embodiment of FIG. 13. A detailed description of the same components will be omitted.

In other words, the insulating film 180 includes the first insulating film 181, the second insulating film 182 and the third insulating film 183. The moduli of the first insulating film 181 and the third insulating film 183 are higher than that of the second insulating film 182.

Referring to FIG. 17, the third insulating film 183 is disposed between the second insulating films 182 that are spaced apart from each other. In other words, the third insulating film 183 contacts the interlayer insulating film 160 and the first insulating film 181 while also contacting the upper surface and the side surface of the second insulating films 182 that are spaced apart from each other.

When the portion not shown by shading is referred to as the first region in FIG. 15, since a portion of the first region that contacts the interlayer insulating film 160 is the second insulating film 182 having a low modulus, the external impact is not transmitted to the interlayer insulating film 160 under the second insulating film 182.

When the portion shown by shading in FIG. 15 is referred to as the second region, since a portion of the second region that contacts the interlayer insulating film 160 is the third insulating film 183 having a high modulus, the external impact is transmitted to the interlayer insulating film 160 under the third insulating film 183. Since the second region is a region not overlapping the transistor or the like, even if an impact is transmitted to the interlayer insulating film 160 and a crack occurs, the crack is not viewed as a defect.

FIG. 18 illustrates a cross-section of an embodiment similar to the embodiment of FIG. 9 and the embodiment of FIG. 14. A detailed description of the same components will be omitted.

In other words, the insulating film 180 of FIG. 18 includes the first insulating film 181, and the fourth insulating film 184 disposed between the second insulating films 182 spaced apart from each other.

The modulus of the first insulating film 181 is larger than that of the second insulating film 182. In addition, the modulus of the fourth insulating film 184 is larger than that of the second insulating film 182 and smaller than that of the first insulating film 181.

Accordingly, the external impact is transmitted through the fourth insulating film 184 having a higher modulus, and the transistor under the second insulating film 182 may be protected from the impact. The portion shown by shading in FIG. 15 is the portion where the fourth insulating film 184 is disposed, and the portion not shown by shading in FIG. 15 is the portion where the second insulating film 182 is disposed.

Although FIG. 15 shows an example of the second region shown by shading, the second region is not limited to the shape shown in FIG. 15.

In other words, the second region may be variously disposed within a range not overlapping the transistor. In addition, in FIG. 15, DATA may refer to a data line.

As described above, in the display device according to the exemplary embodiments of the present invention, the insulating films having different moduli are disposed in the first region overlapping the transistor and the second region not overlapping the transistor. By disposing an insulating film having a higher modulus than that in the first region in the second region, the impact applied from outside the display panel is transmitted to the second region, and thus, it is possible to prevent the structure of the transistor under the first region from being damaged.

While this invention has been particularly shown and described with reference to exemplary embodiments thereof, it is to be understood by those skilled in the art that various modifications may be made thereto without departing from the spirit and scope of the present invention as set forth in the appended claims.

What is claimed is:

1. A display device, comprising:
a substrate;
a plurality of transistors disposed on the substrate; and
a multi-layer insulating film disposed on the transistors,
wherein the multi-layer insulating film includes a first insulating film and a second insulating film,
the multi-layer insulating film includes a first region in which the first insulating film and the second insulating film overlap each other in a direction perpendicular to the substrate and a second region in which the first insulating film is disposed,
the first region overlaps the plurality of transistors, and
a modulus of the second insulating film is lower than a modulus of the first insulating film,
wherein the modulus of the first insulating film and the modulus of the second insulating film is Young's modulus,
the first insulating film is not disposed between the second insulating film and the substrate,
the first insulating film is in direct contact with a top surface of the second insulating film while extending along the top surface from a first side of the second insulating film to a second side of the second insulating film opposite the first side, and
a portion of the first insulating film does not overlap the second insulating film in the direction perpendicular to the substrate.

2. The display device of claim 1, wherein
a plurality of the second insulating films overlap the transistors and are spaced apart from each other, and
the first insulating film is disposed between the second insulating films and on an upper surface of the second insulating films.

3. The display device of claim 1, wherein
the second region does not overlap the transistors in the direction perpendicular to the substrate.

4. The display device of claim 1, wherein
the modulus of the first insulating film is 5 to 30 times the modulus of the second insulating film.

5. The display device of claim 1, wherein
the modulus of the first insulating film is 80 GPa to 150 GPa.

6. The display device of claim 1, wherein
the modulus of the second insulating film is 5 GPa to 10 GPa.

7. The display device of claim 1, wherein
the first insulating film includes an inorganic material, and the second insulating film includes an organic material.

8. The display device of claim 1, wherein
the first region overlaps a data line.

9. The display device of claim 8, wherein
the first region is disposed between adjacent scan lines.

10. The display device of claim 1, further comprising:
an interlayer insulating film disposed between the transistors and the multi-layer insulating film, wherein
the interlayer insulating film and the second insulating film contact each other in the first region, and
the interlayer insulating film and the first insulating film contact each other in the second region.

11. A display device, comprising:
a substrate;
a plurality of transistors disposed on the substrate;
an interlayer insulating film disposed on the transistors; and
a multi-layer insulating film disposed on the interlayer insulating film,
wherein the multi-layer insulating film includes a first insulating film and a second insulating film,
the multi-layer insulating film includes a first region overlapping the transistors and a second region not overlapping the transistors,
the second insulating film directly contacts the interlayer insulating film in the first region,
the first insulating film contacts the interlayer insulating film in the second region, and
a modulus of the first insulating film is larger than a modulus of the second insulating film,
wherein the modulus of the first insulating film and the modulus of the second insulating film is Young's modulus,
the first insulating film is not disposed between the second insulating film and the substrate, and
the first insulating film is in direct contact with a top surface of the second insulating film while extending along the top surface from a first side of the second insulating film to a second side of the second insulating film opposite the first side, and
a portion of the first insulating film does not overlap the second insulating film in a direction perpendicular to the substrate.

12. The display device of claim 11, wherein
the modulus of the first insulating film is 5 to 30 times the modulus of the second insulating film.

13. The display device of claim 11, wherein
the modulus of the first insulating film is 80 GPa to 150 GPa.

14. The display device of claim 11, wherein
the modulus of the second insulating film is 5 GPa to 10 GPa.

15. The display device of claim 11, wherein
the first region overlaps a data line.

16. The display device of claim 11, wherein
the first region is disposed between adjacent scan lines.

17. A display device, comprising:
a substrate;
first and second transistors disposed on the substrate; and
a multi-layer insulating film disposed on the first and second transistors,
wherein the multi-layer insulating film includes a first insulating film and a second insulating film,
the first insulating film and the second insulating film overlap each other and the first and second transistors,
the first insulating film and the second insulating directly contact an interlayer insulating film, and
a modulus of the second insulating film is different than a modulus of the first insulating film, wherein the modulus of the first insulating film and the modulus of the second insulating film is Young's modulus, the first insulating film is not disposed between the second insulating film and the substrate, and the first insulating film is in direct contact with a top surface of the second insulating film while extending along the top surface from a first side of the second insulating film to a second side of the second insulating film opposite the first side.

18. The display device of claim 17, wherein first and second electrodes of the first transistor are disposed in the interlayer insulating film.

19. The display device of claim 17, wherein the first insulating film is disposed on an upper and a side surface of the second insulating film.

* * * * *